United States Patent
Jones et al.

(10) Patent No.: US 9,484,860 B2
(45) Date of Patent: Nov. 1, 2016

(54) TRACKING POWER SUPPLY WITH INCREASED BOOST CAPABILITY

(71) Applicant: THX Ltd, San Francisco, CA (US)

(72) Inventors: Owen Jones, Ipswich (GB); Lawrence R. Fincham, Santa Rosa, CA (US)

(73) Assignee: THX Ltd., San Francisco, CA (US)

( * ) Notice: Subject to any disclaimer, the term of this patent is extended or adjusted under 35 U.S.C. 154(b) by 55 days.

(21) Appl. No.: 13/797,473

(22) Filed: Mar. 12, 2013

(65) Prior Publication Data

US 2014/0266468 A1 Sep. 18, 2014

(51) Int. Cl.
*H03F 1/02* (2006.01)
*H03F 3/185* (2006.01)

(52) U.S. Cl.
CPC ........... *H03F 1/0211* (2013.01); *H03F 1/0238* (2013.01); *H03F 3/185* (2013.01)

(58) Field of Classification Search
USPC ......... 330/297, 127, 129, 134, 279; 381/120
See application file for complete search history.

(56) References Cited

U.S. PATENT DOCUMENTS

| | | | |
|---|---|---|---|
| 4,218,660 A | 8/1980 | Carver | 330/297 |
| 4,337,441 A | 6/1982 | Kellogg | 330/261 |
| 4,445,095 A | 4/1984 | Carver | 330/297 |
| 4,507,619 A | 3/1985 | Dijkstra et al. | 330/297 |
| 4,586,002 A | 4/1986 | Carver | 330/297 |
| 4,620,317 A | 10/1986 | Anderson | 381/90 |
| 4,752,747 A | 6/1988 | Botti et al. | |
| 5,157,353 A | 10/1992 | Lendaro | 330/297 |
| 5,748,753 A | 5/1998 | Carver | 381/96 |
| 6,104,238 A | 8/2000 | Mattisson et al. | 329/319 |
| 6,166,605 A | 12/2000 | Carver | 330/297 |
| 6,373,335 B1 | 4/2002 | Carver | 330/10 |
| 6,373,340 B1 * | 4/2002 | Shashoua | 330/297 |
| 6,498,521 B1 | 12/2002 | Bicakci et al. | |
| 6,636,103 B2 | 10/2003 | Wurcer et al. | |

(Continued)

FOREIGN PATENT DOCUMENTS

| | | |
|---|---|---|
| DE | 44 10 498 | 10/1994 |
| DE | 44 00 435 | 7/1995 |

(Continued)

OTHER PUBLICATIONS

Walker, P.J., et al., "Current Dumping Audio Amplifier," Acoustical Mfg. Co. Ltd., Huntingdon, England, L-46, Wireless World, Feb. 1971, 5 pages.

(Continued)

*Primary Examiner* — Hieu Nguyen
(74) *Attorney, Agent, or Firm* — Ben J. Yorks; Irell & Manella LLP

(57) ABSTRACT

A tracking power supply for one or more amplifiers includes one or more cascaded sets of power boost circuits to temporarily boost the positive and/or negative power supply rail, respectively. Each power boost circuit may include a gain element and an energy source such as a capacitor or battery, and the power boost circuits are linked to provide a greater degree of voltage boost when needed. An optional control circuit monitors amplifier output signal levels, or separately amplified input signal levels, and provides power boost control signals to the power boost circuits, which temporarily raise or lower the positive and/or negative supply voltages above or below the nominal voltage rails in tandem with the highest and lowest output signals, respectively, from the amplifier(s).

33 Claims, 19 Drawing Sheets

(56) References Cited

U.S. PATENT DOCUMENTS

| | | | |
|---|---|---|---|
| 7,834,702 B2 | 11/2010 | Jones et al. | 330/297 |
| 8,138,837 B2 | 3/2012 | Jones et al. | 330/297 |
| 2002/0089313 A1 | 7/2002 | Shashoua | 323/209 |
| 2002/0094795 A1 | 7/2002 | Mitzlaff | 455/245.1 |
| 2002/0153940 A1 | 10/2002 | Wurcer et al. | 327/536 |
| 2003/0123678 A1 | 7/2003 | Kemmerer et al. | |
| 2005/0129258 A1 | 6/2005 | Fincham | |
| 2005/0259831 A1 | 11/2005 | Hutt et al. | |
| 2006/0126860 A1 | 6/2006 | Sievers et al. | |
| 2006/0126862 A1 | 6/2006 | Andrews et al. | |
| 2007/0140513 A1 | 6/2007 | Furge | |
| 2013/0034251 A1 | 2/2013 | Fincham | |
| 2013/0272547 A1* | 10/2013 | Waller, Jr. | 381/120 |

FOREIGN PATENT DOCUMENTS

| | | |
|---|---|---|
| EP | 0 969 593 | 1/2000 |
| JP | 56 007504 | 1/1981 |
| JP | 57 154913 | 9/1982 |
| JP | 6-291561 | 10/1994 |
| NL | 8 601 639 | 1/1988 |
| WO | WO 01/043276 | 12/1999 |

OTHER PUBLICATIONS

Vanderkooy, John, et al., "Feedforward Error Correction in Power Amplifiers," Journal of the Audio Engineering Society, 1980 Jan./Feb., vol. 28, No. 1/2, pp. 2-16.

STA550, 50+50W Stereo Bash Power Amplifier, Product Review, STMicroelectronics, Jul. 2001.

STA5150, 150W Mono Bash Power Amplifier, Product Review, STMicroelectronics, Jul. 2001.

STA5100, 100W Mono Bash Power Amplifier, Product Review, STMicroelectronics, Aug. 2001.

"Understanding BCA class-I," Crown Audio Inc., 2002.

Assembling Instructions, FT326, 70W Class H Booster, Futurel, Apr. 22, 2001.

"TDA156Q; 70 W high efficiency power amplifier with diagnostic facility" Koninklijke Philips N.V., 2002.

Extended European Search Report, dated Oct. 28, 2011, EPO Patent Appln. No. 08166844.4.

Partial European Search Report, dated Jun. 21, 2011, EPO Patent Appln. No. 08166844.4.

* cited by examiner

TRACKING POWER SUPPLY WITH INCREASED BOOST CAPABILITY

BACKGROUND OF THE INVENTION

1. Field of the Invention

The field of the present invention relates to power amplification and, more specifically, to apparatus and methods for amplifying electronic signals such as audio signals.

2. Background

With a conventional power amplifier, the maximum available output power is generally limited by at least two factors: the voltage swing available at the amplifier's output, and the load impedance. The voltage swing is itself typically limited by the amplifier rail voltage. In the case of a car audio amplifier for instance, the rail voltage is the nominal 14.4 Volts of the car battery; thus, if the amplifier were able to swing all the way up to the power rails, it could deliver ~7 Volts peak output. This peak voltage is only sufficient to deliver about 3 Watts of power to an 8Ω load. To obtain greater output power, the load impedance can be reduced (for example, a 1Ω load would allow 25 Watts of output power), but in order not to encounter significant losses in the wiring, the cables need to be thicker and heavier.

In general, lowering the load impedance on an amplifier will increase the current that has to be supplied by the amplifier and increase the amplifier distortion as well as requiring more expensive output devices. Thus, merely lowering the load impedance by itself may not provide additional power. It would therefore be advantageous to be able to increase the voltage output available from the amplifier so that, for example, a higher load impedance can be employed and/or greater power be delivered to a load.

One technique for increasing output voltage is known as bridging, whereby two anti-phase amplifiers are used with the load tied between their outputs. This approach can double the available output swing and for a given load impedance, which would quadruple the output power. Even so, the maximum available power to a 1Ω load, using the typical power supply conditions described above, would be limited to approximately 100 Watts, and would still have the complication of a low impedance load. However, this simplified analysis hides the fact that under these conditions, each amplifier is not only having to supply twice the output current as compared to the non-bridged condition, but also sees half the effective load impedance. In practical applications, the amplifiers may not be able to supply the required current.

A more valid comparison might be to calculate the maximum output that can be achieved for a given maximum output current capability. In the case of the bridge amplifier, the load impedance would therefore be double that used for the single amplifier example. With twice the load resistance, the power into the load is only twice that of the single amplifier. The effective load impedance seen by each half of the bridge amplifier is now the same as the single amplifier example and given that the load current sourced by the amplifier is the same, then the amplifier distortion is the same also.

For applications in which the amplifier is driving a speaker load for audio sound reproduction, the bridge amplifier could be replaced by two single amplifiers, each driving one of a pair of voice coils on a dual voice coil loudspeaker. The overall output level from the loudspeaker would then be identical for the bridge amplifier and the two single amplifiers.

Another technique to increase effective power output is to employ a switching power supply to raise the power supply voltage to the amplifier. The amplifier output voltage capability is thereby increased, allowing a higher load impedance to be used for a given output current capability. This approach can mitigate the need for a low load impedance. However, a switching power supply typically operates at high frequency and high power and needs careful design to avoid interference.

Another technique, which has been employed, for example, by Philips Semiconductors of Eindhoven, the Netherlands, in its TDA1560/1562 products, involves an amplifier system that modulates its own supply voltage in order to provide a higher output voltage swing. A bridge amplifier is used in conjunction with a capacitive booster circuit that lifts the supply to approximately twice the steady-state level when a larger output voltage swing is required. Under quiescent conditions, the output of each amplifier in the bridge sits at approximately half the battery voltage. As the output of one half of the bridge amplifier approaches the positive supply rail, the booster circuit begins to lift the supply voltage so that the amplifier does not clip. However, at the same time, the output of the other half of the bridge amplifier approaches ground. The output can go no lower than ground potential, and so the amplifier system adds the difference between the actual negative going output and the desired negative going output to the positive going output at the other side of the bridge amp. This operation can result in significantly distorted waveforms at each individual output of the bridge amplifier, but the output measured differentially across the two outputs is generally linear (within the limitations of the correction circuitry). The booster circuit adjusts to maintain sufficient headroom above this modified output waveform. Thus the bridge amplifier output is able to increase sufficiently to give a peak output voltage close to twice the battery voltage, at the expense that this technique can generally only be used in bridge amplifier mode.

While the foregoing approaches may increase the effective output capability of an amplifier, they still have appreciable limitations. It would therefore be advantageous to provide an improved audio amplification apparatus or method which overcomes one or more of the foregoing problems or limitations, provides increased power output when needed, and/or provides other benefits and advantages.

Another approach that has been developed for providing temporary increased power output when needed is disclosed in U.S. Pat. No. 7,834,702, entitled "Efficient Power Amplifier," assigned to the assignee of the present invention. That patent generally describes a variety of embodiments of a tracking power supply that temporarily raises the power rails to an amplifier when the output voltage approaches the nominal rail value. While this patent represents an improvement over the state of the art in a variety of respects, there may be situations where even greater voltage levels are required.

It would therefore be advantageous to provide an improved audio amplification apparatus or method which has an ability to provide greater voltage boosts when needed. It would further be advantageous to provide an efficient audio amplification apparatus or method which provides increased power output without the need for a bridge amplifier or a switching power supply.

SUMMARY OF THE INVENTION

Certain embodiments disclosed herein are generally directed, in one aspect, to a power boost circuit for an amplification system. The power boost circuit receives, as an input, an output signal from an amplifier receiving a power supply input voltage signal from a power supply rail. The power boost circuit tracks the output signal from the amplifier and temporarily boosts the power supply input voltage signal feeding the amplifier up to some multiple of the nominal power rail voltage, by drawing current from one or more cascaded power boost circuits each including a stored energy source such as a reservoir capacitor or battery, when the output signal from the amplifier approaches the power supply rail voltage within a predetermined threshold. The power boost circuit may continuously maintain the power supply input voltage signal above the power supply rail voltage by the amount of the predetermined threshold.

In another aspect, an amplification system has independent positive and negative power supply rail boost capability through a first cascaded power boost circuit and a second cascaded power boost circuit which each receive, as an input, an output signal from an amplifier to be supplied. The first cascaded power boost circuit and said second cascaded power boost circuit are selectively engaged to temporarily boost positive and negative power supply input voltage levels to the amplifier as the output signal from said amplifier approaches or exceeds a positive power supply rail or a negative power supply rail, respectively.

In yet another aspect, a dynamic amplification system for providing power to a plurality of amplifiers includes a first power boost amplifier system electrically connected to a first power supply rail and a second power boost amplifier system electrically connected to a second power supply rail. A power boost control circuit monitors output signal levels from the plurality of amplifiers and provides power boost control signals to the power boost amplifier systems. As a result, the first power boost amplifier system temporarily boosts the first power supply rail above a first nominal voltage level in tandem with the highest output signal level from the amplifiers, and the second power boost amplifier system temporarily lowers the second power supply rail below a second nominal voltage level in tandem with the lowest output signal level from said amplifiers. In certain embodiments, the first power boost amplifier system may draw current from a first plurality of stored energy sources (such as reservoir capacitors or batteries, or hybrids such as super-capacitors or ultra-capacitors) when active to boost the first power supply rail above the first nominal voltage level, and, similarly, the second power boost amplifier system may draw current from a second plurality of stored energy sources (such as reservoir capacitors or batteries, or hybrids such as super-capacitors or ultra-capacitors) when active to lower the second power supply rail below the second nominal voltage level.

In yet a further aspect, an tracking power supply for an amplification system has an independent positive power supply rail boost capability through a cascaded first and second positive power boost circuit, and an independent negative power supply rail boost capability through a cascaded first and second negative power boost circuit. Each power boost circuit receives, as an input, an output signal from an amplifier to be supplied. The first positive power boost circuit and second positive power boost circuit are selectively engaged to temporarily boost positive supply input voltage levels to the amplifier as the output signal from said amplifier approaches or exceeds a positive power supply rail. The first negative power boost circuit and second negative power boost circuit are selectively engaged to temporarily boost negative supply input voltage levels to the amplifier as the output signal from said amplifier approaches or exceeds a negative power supply rail.

Further embodiments, variations and enhancements are also disclosed herein.

DETAILED DESCRIPTION OF PREFERRED EMBODIMENTS

Certain embodiments disclosed herein are generally directed, in one or more aspects, to a power boost system or circuit which tracks an amplifier input or output signal and temporarily boosts the power supply voltage signal feeding the amplifier when required by the needs of the amplifier output signal. At least some of these embodiments are designed to enable a larger peak-to-peak voltage swing of, e.g., over three times the supply or battery voltage, without necessarily the use of a bridged amplifier configuration or the need for a high frequency switching power supply. Some of these embodiments may also provide for greater efficiency than a standard amplifier configuration, especially with audio signal amplification, thereby reducing heat-sinking requirements. The high output voltage swing also may, in at least some cases, permit a relatively normal load impedance to be used.

According to various embodiments as disclosed herein, a tracking power supply for an amplifier includes one or more cascaded sets of power boost circuits configured to temporarily boost positive and/or negative power supply rails. Each power boost circuit may include a gain element and a stored energy source (such as a capacitor or battery), and the power boost circuits are linked in a cascade fashion to provide a greater degree of voltage boost when needed. An optional control circuit monitors amplifier output signal levels, or separately amplified input signal levels, and provides power boost control signals to the power boost circuits, which temporarily raise or lower the positive and/or negative supply voltages above or below the nominal voltage rails in tandem with the highest and lowest output signals, respectively, from the amplifier(s).

Embodiments as disclosed herein may be employed in a variety of applications, and may be particularly well suited for situations in which it is desired to attain a temporary boost in output power. In particular, various embodiments as described herein may be well suited for audio amplification systems which may operate mostly within the bounds of the nominal voltage rails but occasionally require peak voltage swings that exceed the nominal voltage rails.

Figure 1:
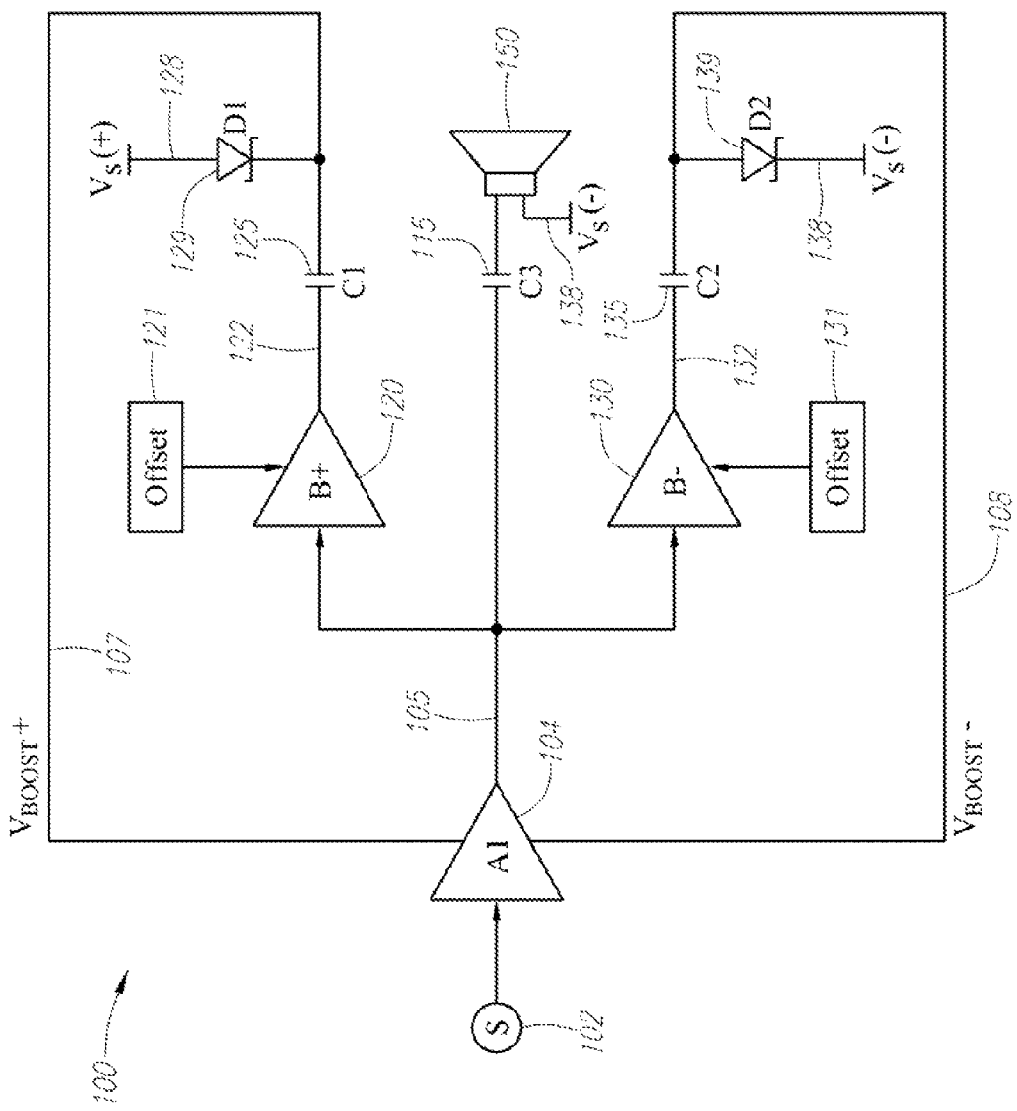
FIG. 1 is diagram of a single-channel power amplifier including power rail boost circuitry as known in the art.

FIG. 1 is a high-level diagram of a single-channel power amplification system 100 as known in the art, and as generally described in detail in U.S. Pat. No. 7,834,702, assigned to the assignee of the present invention, and incorporated by reference as if set forth fully herein. In FIG. 1, a main amplifier 104 (denoted "A1") amplifies a source signal 102. The main amplifier 104 may be of any conventional design, although it preferably has a high power supply rejection ratio (PSRR). The main amplifier 104 in this example is connected to a loudspeaker 150, optionally through a coupling capacitor 115 ("C3"), in a conventional manner. The main amplifier 104 is coupled to the power supply lines 128 (Vs+) and 138 (Vs−) through diodes 129 ("D1") and 139 ("D2"), respectively. Diodes 129 and 139 may be Schottky type diodes so as to provide rapid switching time and also to maximize the potential boost level.

Positive power boost amplifier 120 (denoted "B+" in part because it pertains to the positive supply voltage) and negative power boost amplifier 130 (denoted "B−" in part because it pertains to the negative supply rail) are coupled to power supply lines 128 (Vs+) and 138 (Vs−), respectively. The positive and negative power boost amplifiers 120 and 130 are coupled to the power supply inputs 107, 108 (denoted Vboost+ and Vboost− in FIG. 1) of the main amplifier 104 via reservoir capacitors 125 ("C1") and 135 ("C2"). Offset signal inputs 121, 131 are coupled to power boost amplifiers 120 and 130, respectively. Offset signal 121 is provided so that the output signal 122 from positive power boost amplifier 120 is at Vs− (the negative supply rail) when its boost function is inactive, and offset signal 131 is provided so that the output signal 132 is at voltage level Vs+ (the positive supply rail) when its boost function is inactive. As a result, the first reservoir capacitor 125 is normally fully charged when the positive boost function is not required, and has a voltage across it of (Vs+−Vs−−VD1), where VD1 is the voltage drop across D1. Likewise, the second reservoir capacitor 135 is normally fully charged when the negative boost function is not required, and has a voltage across it of (Vs+−Vs−−VD2), where VD2 is the voltage drop across D2. With a 14.4V power supply, the voltage across each of the reservoir capacitors 125, 135 would thus typically be about 13.9 Volts.

In operation, power boost amplifiers 120 and 130 sense the output of the main amplifier 104, and produce output signals 122, 132 that drive the power supply inputs 107, 108 of the main amplifier 104 via reservoir capacitors 125 ("C1") and 135 ("C2"). Under quiescent conditions, the DC output voltage of the main amplifier 104 to be supplied generally lies halfway between the positive and negative power supply rails Vs+ and Vs−. When the required output of the main amplifier 104 is less than the limits imposed by power supply rails Vs+ and Vs−, the amplification system 100 operates as a conventional amplifier. In other words, the main amplifier 104 draws power from the positive and negative supply lines 128, 138 via D1, D2 respectively, and the source signal 102 is amplified by main amplifier 104 in a conventional manner.

However, when the source signal 102 reaches amplitudes requiring that the output signal 105 approach or exceed the power supply rails 128 (Vs+) and/or 138 (Vs−), the operation of the amplification system 100 changes to allow increased power output. The main amplifier 104 normally derives current from the power supply rails Vs+ and Vs− via diodes D1 and D2 (129 and 139), and delivers power to the load, i.e., the loudspeaker 150. Thus, the maximum peak-to-peak output voltage under ordinary conditions, without the effect of positive or negative power boost amplifiers 120, 130, is generally given by the equation: (Vs+−Vs−)−(VD1+VD2); that is, the maximum peak-to-peak output voltage is the difference between the positive and negative supply rails less the voltage drops caused by diodes 129, 139. In the amplification system 100, as the output voltage from the main amplifier 104 approaches the positive or negative supply rail, power boost amplifier 120 or 130 (depending upon the polarity of the signal) will force a temporary increase to power supply input(s) 107 and/or 108 as needed, allowing the main amplifier 104 to increase the amplitude of its output signal 105 and its overall power output.

The power boost operation of amplification system 100 will now be explained in greater detail, taking first the example where the source signal 102 is positive and will require a boost in the positive power supply input 107. As the output signal 105 from the main amplifier 104 approaches the positive supply rail Vs+ within a certain, range (typically 1.5 Volts) of Vs+, the output 122 of power boost amplifier 120 (B+) starts to rise up from its quiescent state, which is at Vs− potential. In its quiescent state, power boost amplifier 120 charges up reservoir capacitor 125 (C1) to a voltage of (Vs+−VD1), where VD1 is the drop in voltage across diode 129 (D1). The rise in output signal 122 caused by the rise in main amplifier output signal 105 is transferred via the reservoir capacitor 125 (C1) to the positive power supply input 107 of the main amplifier 104, raising its potential (Vboost+). As this occurs, diode 129 (D1) is cut off so that the positive power supply input 107 of main amplifier 104 becomes isolated from the positive power supply rail Vs+ and, instead, its input current is derived from the output of power boost amplifier 120 (B+) via reservoir capacitor 125 (C1). As a result, the main amplifier output signal 105 is no longer limited by the positive power supply rail Vs+.

If power boost amplifier 120 (B+) has, for example, unity gain, then the voltage level of positive power supply input 107 to main amplifier 104 tracks the main amplifier 104's output voltage, albeit with an offset of some amount, so that the difference between the voltage level of the main amplifier output 105 and its supply voltage, Vboost+, is held relatively constant at, e.g., approximately 1.5 Volts. Thus the output 105 of the main amplifier 104 is permitted rise above the positive power supply voltage Vs+ while preventing saturation and/or clipping.

This manner of operation may continue until the output 122 of power boost amplifier 120 reaches the positive rail voltage Vs+ and clips. The main amplifier's positive power supply input 107 (Vboost+) then rises no further, and the output 105 of the main amplifier 104 can then only rise slightly higher until it too clips at a final potential of (2 Vs+−VD1).

When the output signal 105 from main amplifier 104 swings the other direction, i.e., negative, then a similar effect occurs with negative power boost amplifier 130 (B−), reservoir capacitor 135 (C2), and diode 139 (D2). These components act in a similar manner to the positive supply components, but instead move the negative power supply input 108 (Vboost−) below the potential of the negative supply rail Vs−. This manner of operation may continue until the output 132 of negative power boost amplifier 130 reaches the negative rail voltage Vs− and clips. The main amplifier's negative power supply input 108 (Vboost−) then drops no further, and the output 105 of the main amplifier 104 can then only drop slightly lower until it too clips at a final potential of (2 Vs−+VD2).

It may be thus seen that both the positive and negative power supply inputs 107 and 108 of main amplifier 104 can be independently boosted, with the positive power supply input 107 being boosted above the positive supply rail Vs+ and the negative power supply input 108 being boosted below the negative supply rail Vs−. This effect provides a large voltage swing capability to the main amplifier 104. An amplification system 100 configured in accordance with FIG. 1 can be built without a bridged amplifier arrangement and without a switching power supply, yet still have a large voltage swing capability.

Figure 2:
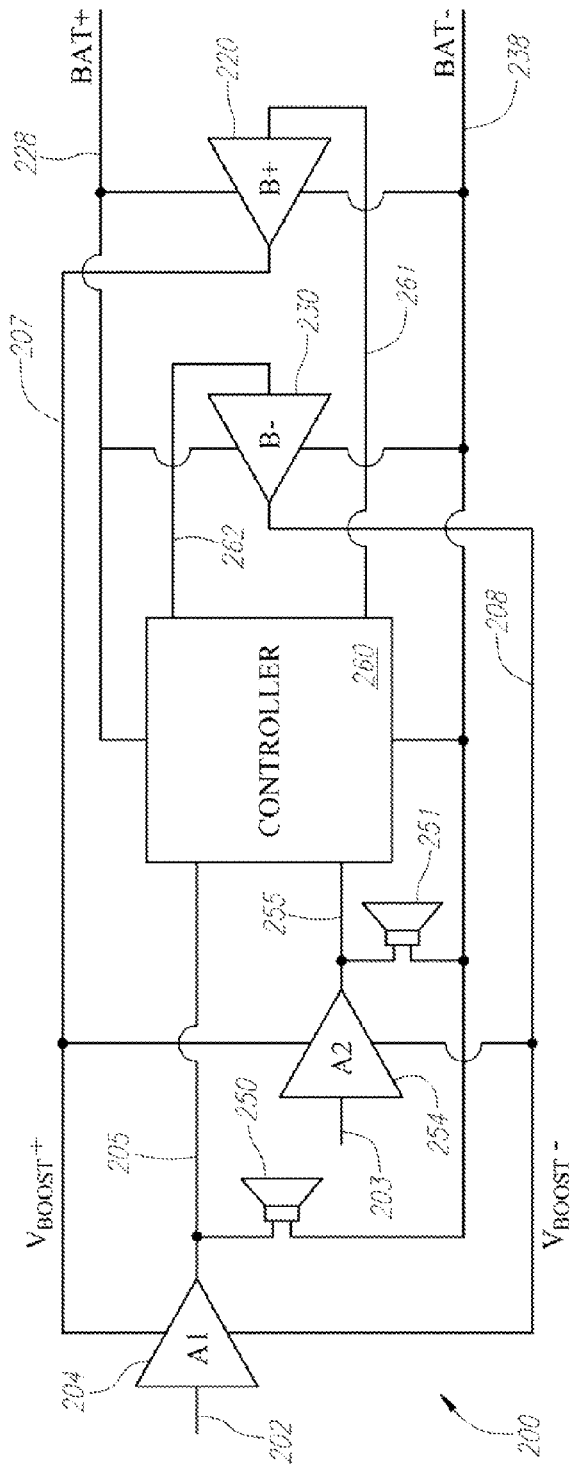
FIG. 2 is a diagram of a dual-channel power amplifier including power rail boost circuitry as known in the art.

The principles of the amplification system 100 illustrated in FIG. 1 may be extended to systems having more than one channel and/or more than one main amplifier. An example of one embodiment of this type as known in the art is illustrated, in somewhat simplified form, in FIG. 2. As shown in FIG. 2, a multi-channel amplification system 200 includes, in this example, two main amplifiers 204, 254 (also denoted "A1" and "A2") to be supplied, and, as in FIG. 1, two power boost amplifiers 220, 230. The output of the first power boost amplifier 220 is coupled to the positive power supply inputs of both main amplifiers 204, 254, while the output of the second power boost amplifier 230 is coupled to the negative power supply inputs of both main amplifiers 204, 254. In other words, the main amplifiers 204, 254 have common power supply inputs. The first main amplifier 204 amplifies a first input source signal 202, and produces an output signal 205 which is provided to a loudspeaker 250 as well as a controller 260. Similarly, the second main amplifier 254 amplifies a second input source signal 203, and produces an output signal 255 which is provided to another loudspeaker 251 as well as the controller 260.

In operation, the amplification system 200 works in a very similar way to the amplification system 100 of FIG. 1. However, since there are now two main amplifiers 204, 254, the controller 260 reacts to the main amplifier 204 or 254 which requires the greatest output, and causes the power boost amplifiers 220, 230 to provide the required supply voltage based thereon. The controller 260 reacts to whichever amplifier output signal 205, 255 is greater in magnitude, and provides the greater of the two amplifier output signals 205, 255 in a positive direction over control line 261 to the first power boost amplifier 220, and the greater of the two amplifier output signals 205, 255 in a negative direction over control line 262 to the second power boost amplifier 230. The positive and negative power supply input boost signals are therefore independently activated. Both the positive and negative power supply input boost signals can be active at the same time.

Figure 3:
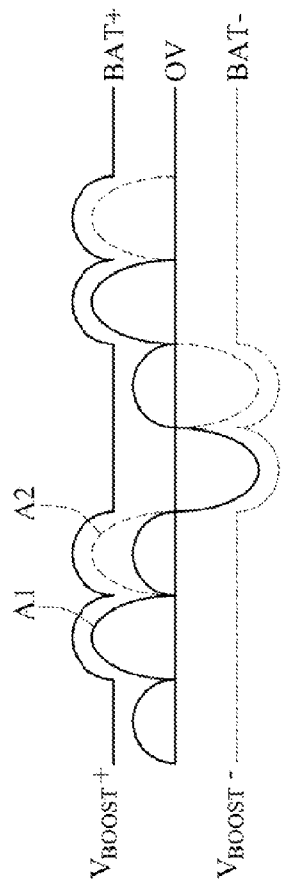
FIG. 3 is a graph illustrating waveforms relating to an example of operation of the power amplifier of FIG. 2.

Further explanation of the operation of the amplification system 200 of FIG. 2 may be made with reference to FIG. 3, which illustrates various simplified waveforms according to one particular example. In FIG. 3, the solid waveform line denoted "A1" represents the output signal 205 from the first main amplifier 204, the dotted waveform line denoted "A2" represents the output signal 255 from the second main amplifier 254, and the solid and dotted lines denoted Vboost+ and Vboost−, respectively, represent the power supply input signals 207, 208 having the same designations in FIG. 2. As shown in FIG. 3, when the voltage level of one of the output signals 205, 255 approaches the positive supply rail voltage, denoted BAT+, the positive power supply input signal Vboost+ tracks it and stays above the output signal level by some offset amount. In a practical implementation, there may be some droop or decay of the offset level over time. Likewise, when the voltage level of one of the output signals 205, 255 approaches the negative supply rail voltage, denoted BAT−, the negative power supply input signal Vboost− tracks it and stays beyond the output signal level by some offset amount, possibly subject to potential decay or droop. As illustrated in FIG. 3, the amplifier output signal 205, 255 having the greatest magnitude at a given time determines whether or not a boost signal will be provided. Since amplifier output signals 205, 255 can be of different polarities at a given time, it is possible that boost signals for both the positive and negative power supply rails will be generated at the same time.

Figure 4:
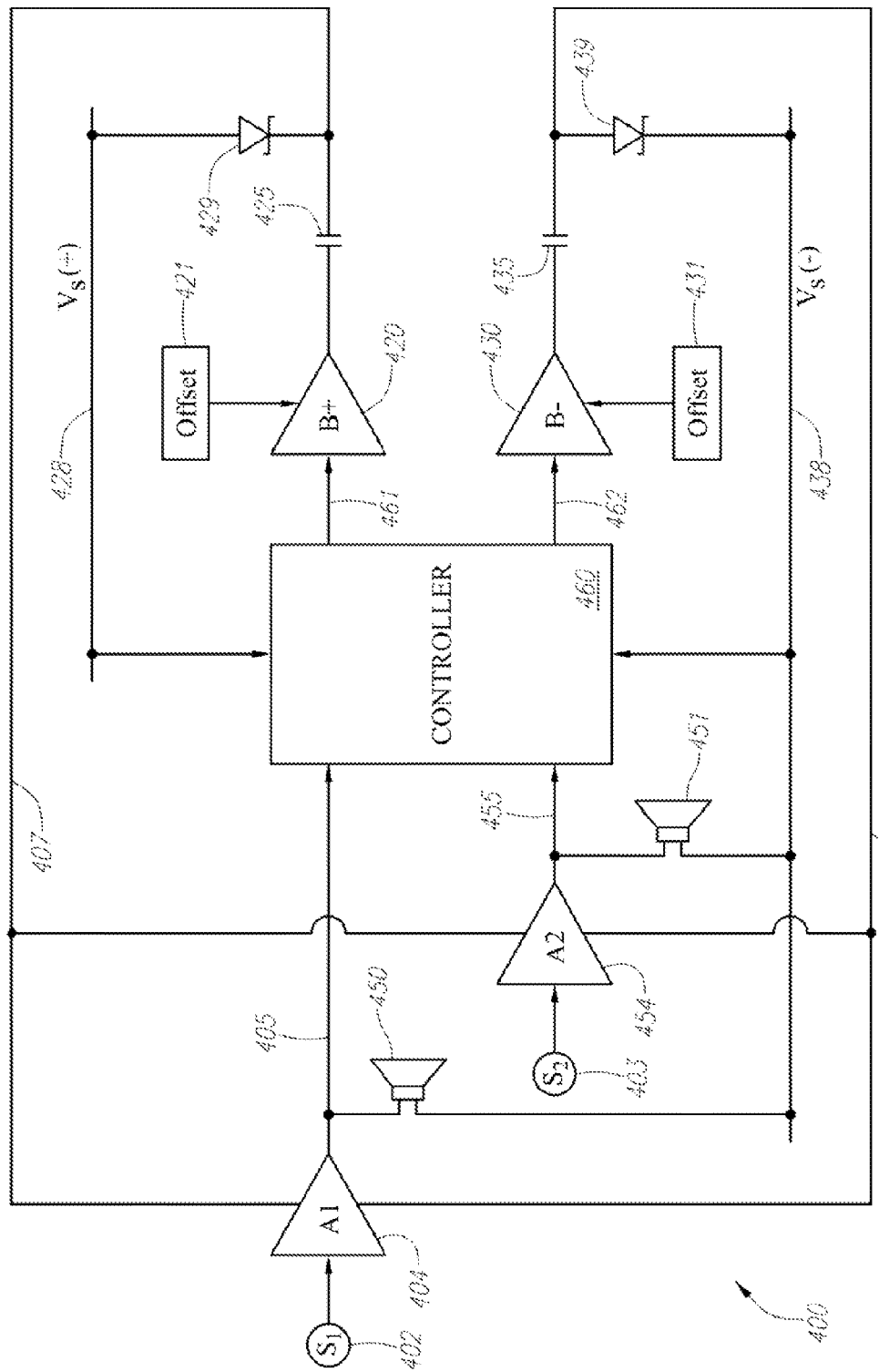
FIG. 4 is a more detailed diagram of a particular power amplifier including power rail boost circuitry, in accordance with various principles illustrated in or discussed with respect to FIG. 2.

FIG. 4 illustrates another example of an amplification system 400 as known in the art and in general accordance with the principles of FIG. 2, but showing some additional details. However, FIG. 4 also depicts the reservoir capacitors 425, 435, diodes 429, 439, and offset circuits 421, 431 which are illustrated and explained in FIG. 1, and which serve the same purpose as the components shown in FIG. 1.

With the amplification systems shown in FIGS. 1, 2 and 4, the gain of power boost amplifiers B+ and B− may be configured to unity, which generally will maintain a constant differential between the output of the main amplifier A1 (or main amplifiers, in a multi-channel or multi-amplifier system) and its supply terminals once the power boost amplifiers B+ or B− come into operation. It is also known that the gain of the power boost amplifiers B+ and B− can be set at slightly greater than unity, in which case the voltage differential will increase with the main amplifier's output signal level. The gain of the power boost amplifiers, B+ and B−, may also be made non-linear to maximize this effect so that the main amplifier(s) A1 and/or A2 can swing close to the positive and negative supply rails, Vs+ and Vs−, before the power boost amplifiers B+ and B− come into operation, thus maximizing the efficiency of the main amplifier(s) A1 and/or A2, yet ensuring sufficient differential across the main amplifier(s) A1 and/or A2 when it is required to deliver high currents.

In certain circumstances, there may be limitations in performance of some of the amplification systems described thus far if prolonged high output is needed, such that voltage decay or droop from the reservoir capacitors begins to make a noticeable impact. When the power supply rails to the main amplifier(s) are being boosted, the current for the main amplifier(s) is being supplied via one of the reservoir capacitors (C1 or C2 in FIG. 1). Supplying the power boost reduces the charge stored in the reservoir capacitor being tapped, and the voltage across the reservoir capacitor decreases. If the power boost is required for a significant period of time, the voltage drop becomes a significant fraction of the peak stored voltage, and the output capability of the amplifier generally decreases. This in turn reduces the output voltage swing for low frequency signals. If the fall in voltage across the reservoir capacitor is sufficient that the main amplifier (e.g., A1) clips before the power boost amplifier B+ or B− has swung fully to the positive or negative voltage supply rail, Vs+ or Vs− as the case may be, then the output of the main amplifier will stop rising, and so too will the output of the power boost amplifier B+ or B−. The voltage across the reservoir capacitor will continue to fall so long as current is still being drawn from it, and so Vboost+/− will start to fall and with it, as will the output of the main amplifier. This fall is communicated to the power boost amplifier, B+ or B−, and a positive feedback action may occur, with the output voltage quickly collapsing. This situation can be prevented with appropriate protection circuitry that can, for example, limit the input voltage under such circumstances.

Figure 5:
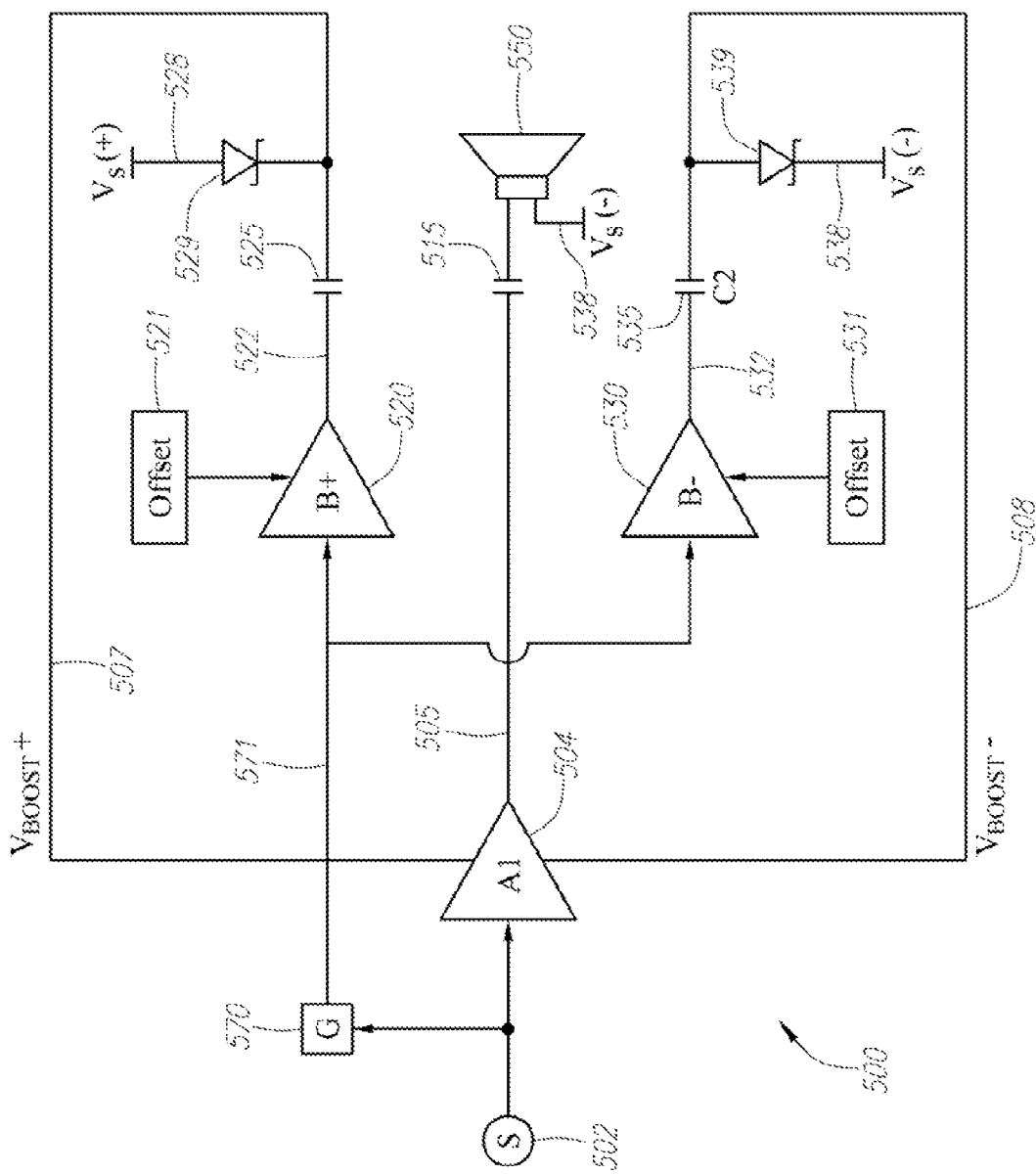
FIG. 5 is a diagram of another example of a single-channel power amplifier including power rail boost circuitry as known in the art.

Another technique for handling such a situation, and as known in the art, is illustrated in FIG. 5. Instead of sensing the output of the main amplifier A1 (denoted 504 in FIG. 5, and 104 in FIG. 1) in order to derive the appropriate drive signals for power boost amplifiers 520 and 530 (i.e., B+ and B−), the input source signal 502 to the main amplifier 504 is sensed instead, via a gain block 570 preferably having the same gain characteristics as the main amplifier 504, and the output 571 from gain block 570 is provided as an input to the power boost amplifiers 520, 530. This configuration breaks the potential positive feedback loop caused by the decay of voltage across the reservoir capacitors 525, 535, and prevents the collapse of the output when the voltage across the reservoir capacitor 525 or 535 drops too much. The output of the main amplifier 504 may still clip, but it will then generally follow the discharge of the reservoir capacitor 525 or 535 rather than fall quickly to zero.

Figure 6:
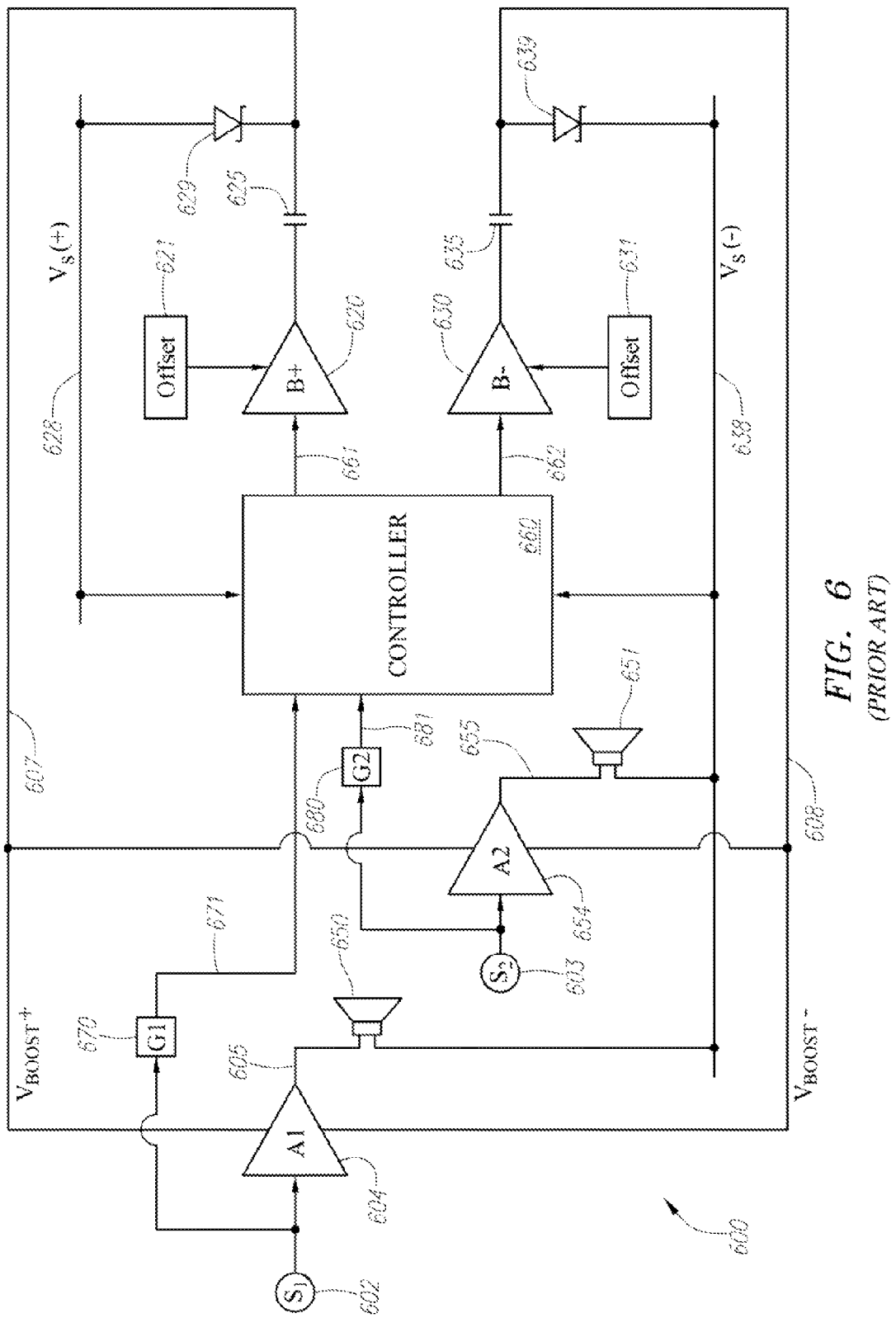
FIG. 6 is a diagram of an example of a dual-channel power amplifier including power rail boost circuitry as known in the art.

FIG. 6 shows a similar scheme as applied to a multi-channel system. Instead of sensing the outputs of the main amplifiers A1 and A2 in order to derive the appropriate drive signals for power boost amplifiers 620 and 630 (i.e., B+ and B−), the input source signals 602, 603 to the main amplifiers 604, 654 are individually sensed instead, via gain blocks 670 and 680, and the outputs 671, 681 from the gain blocks 670, 680 are provided to controller 660 which in turn provides the appropriate input signals 661, 662 to the power boost amplifiers 620, 630. Similar to the examples of FIGS. 2 and 4, the greater of gain block output signals 671, 681 derived from input source signals 602, 603 will be passed along to the power boost amplifiers 661, 662. The main amplifiers 604, 654 may have different gains, provided that either the gain blocks 670, 680 or the controller 660 take account of this fact.

Figure 7A:
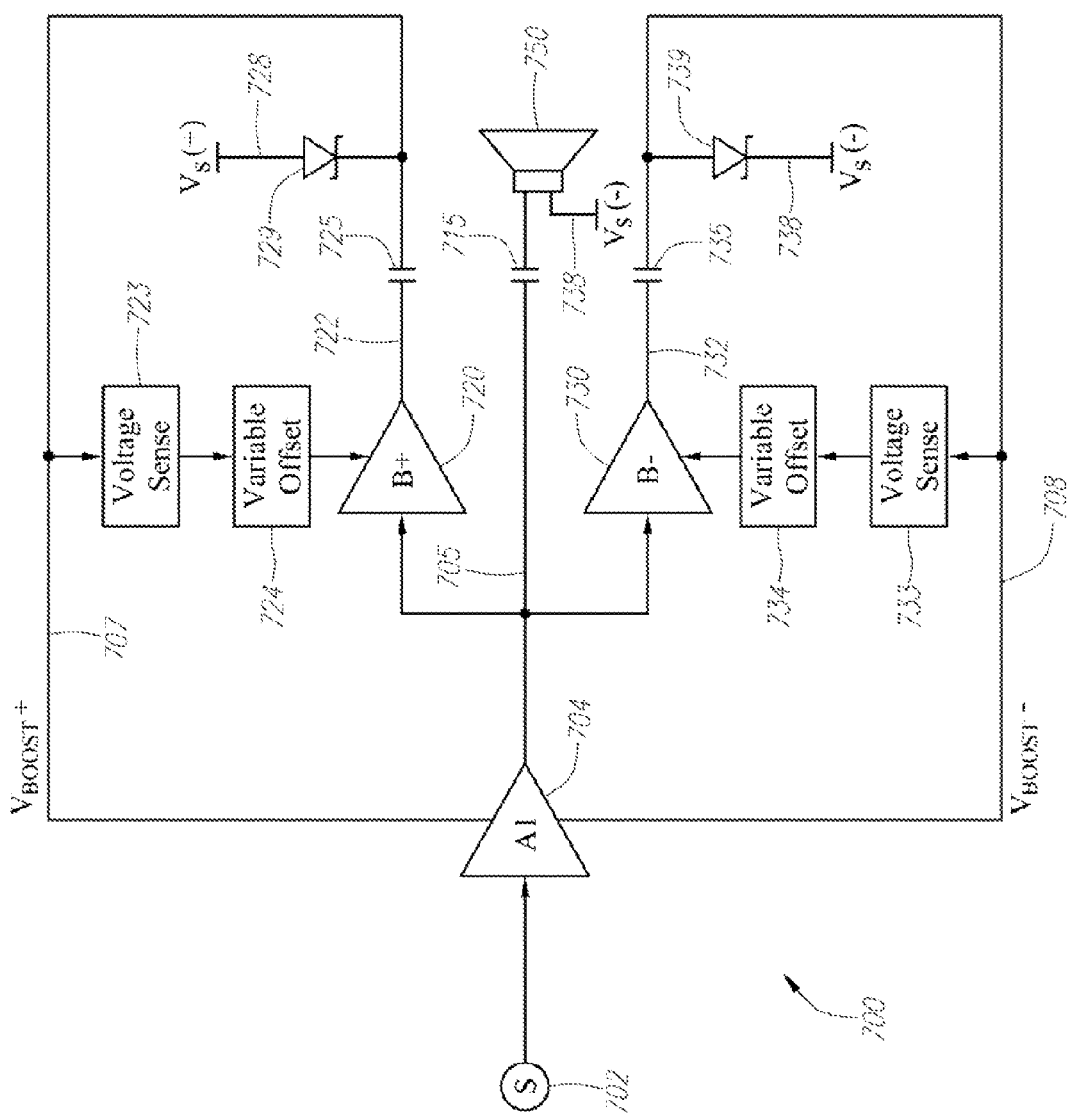
FIG. 7A is a diagram of another example of a single-channel power amplifier including power rail boost circuitry as known in the art, and which adjusts for decay or droop.

Yet another known technique to avoid the aforementioned overload problem, but while avoiding the need to match the gain of power boost amplifiers B+ and B− to be approximately the same as the main amplifier A1, is shown in FIG. 7A. The general premise behind the approach of the amplification system 700 in FIG. 7A is to sense directly the difference between the output voltage of the main amplifier 704 and its supply voltage, and to drive the output of the power boost amplifiers 720, 730 in such a way as to keep this difference constant. To this end, the power boost amplifiers 720, 730 are generally implemented as high gain type amplifiers and incorporate the output and power supply terminals of the main amplifier 704 in a negative feedback loop.

In this example, positive supply voltage sense circuit 723 and negative supply voltage sense circuit 733 sense the levels of the positive and negative supply voltages, respectively. These values are combined with the normal fixed offset, to arrive at a variable offset value, as reflected by variable offset circuits 724, 734 depicted in FIG. 7A. The negative feedback loop comes into operation once the output of the main amplifier 704 reaches to within a predetermined voltage difference from the power supply rail. At low output levels, power boost amplifiers 720, 730 are held at the positive and negative supply rails, Vs+ and Vs− respectively, as in the previous embodiments, and the main amplifier 704 operates from the power supply rails Vs+ and Vs− as a normal amplifier. But as soon as the output of the main amplifier 704 reaches to within a certain amount (e.g., 1.5 Volts) of the positive supply rail Vs+, then the feedback loop starts to drive the output of power boost amplifier 720 positive (a similar phenomenon occurs with respect to the other power boost amplifier 730 when the output of the main amplifier 704 reaches within a certain amount of the negative supply rail Vs−). This action drives the power supply input signal 707, or Vboost+, in a positive direction, via reservoir capacitor 725, which therefore acts to reduce the difference voltage between the output 705 of the main amplifier 704 and its positive power supply input 707. This effect, in turn, reduces the drive signal into the positive side power boost amplifier 720.

The foregoing effects result from the action of the negative feedback loop, and provided that the loop is designed to be stable, act to prevent the difference between the output 705 of the main amplifier 704 and its positive supply voltage falling below the reference level. The voltage level of the output signal 705 of the main amplifier 704 is determined by the signal applied to its input, as is normal for an amplifier in its linear region of operation, so the action of the feedback loop once operational is to allow the power supply voltage to track at a predetermined offset (e.g., 1.5 Volts) above the output voltage of the main amplifier 704. As a result, the main amplifier 704 does not clip, and continues to drive an increasing voltage into the load so long as the power boost amplifiers 720, 730 are not clipping. The effect therefore is similar to the previous examples with respect to increased output capability and ultimate clipping levels and efficiency of the main amplifier 704.

To prevent the finite gain of power boost amplifiers 720, 730 from causing the voltage difference to decrease at large voltage swings, and instead have the voltage difference increase at high output levels, a modification can be made to the amplification system 700 of FIG. 7A. As previously explained, the system 700 illustrated in FIG. 7A senses the difference between the output of the main amplifier 704 and its supply terminals, and acts to prevent this difference falling below a certain reference level. If instead of a constant reference level, the reference is made to increase in proportion with the output level, as implemented in variable offset circuits 724, 734, then the effect will be to offset the error due to the finite gain of the power boost amplifiers 720, 730. If the proportionality constant is appropriately chosen, the effect of limited gain can be exactly cancelled so that the difference between the output 705 of the main amplifier 704 and its power supply terminals will be maintained at a constant voltage once the feedback loop operates. If the proportionality constant is higher than this amount, the voltage difference will increase with output level, mimicking the characteristic obtained with the original variation of the embodiment of FIG. 1 in which the power boost amplifiers 120 and 130 (B+ and B−) were given a gain of greater than unity.

The feedback arrangement described with respect to FIG. 7A also overcomes potential drooping of the reservoir capacitor voltage. Because the reservoir capacitors 725, 735 are enclosed within the feedback loop, the droop will initially have no effect. The power boost amplifier 720 or 730 will be automatically driven harder to compensate for the droop. Once the power boost amplifier 720 or 730 saturates at its supply rails, this correction will no longer occur, and the output of the main amplifier 704 will be driven into clipping, but there will generally not be a collapse of output voltage.

The technique of FIG. 7A may be used in multi-channel configurations, as illustrated, for example, in FIG. 8A, again allowing more than one main amplifier to be powered from one set of power boost amplifiers B+/B−. Rather than sense the output of one amplifier and the supply voltage terminals to derive a difference voltage, as with FIG. 7A, the difference between the supply voltage and the largest output of any of the main amplifiers 804, 854 in FIG. 8A, as determined by controller 860, is used to drive the feedback loop. In this way, it can be ensured that the power supply voltage is always large enough to prevent any of the main amplifiers 804, 854 from clipping.

Figure 7B:
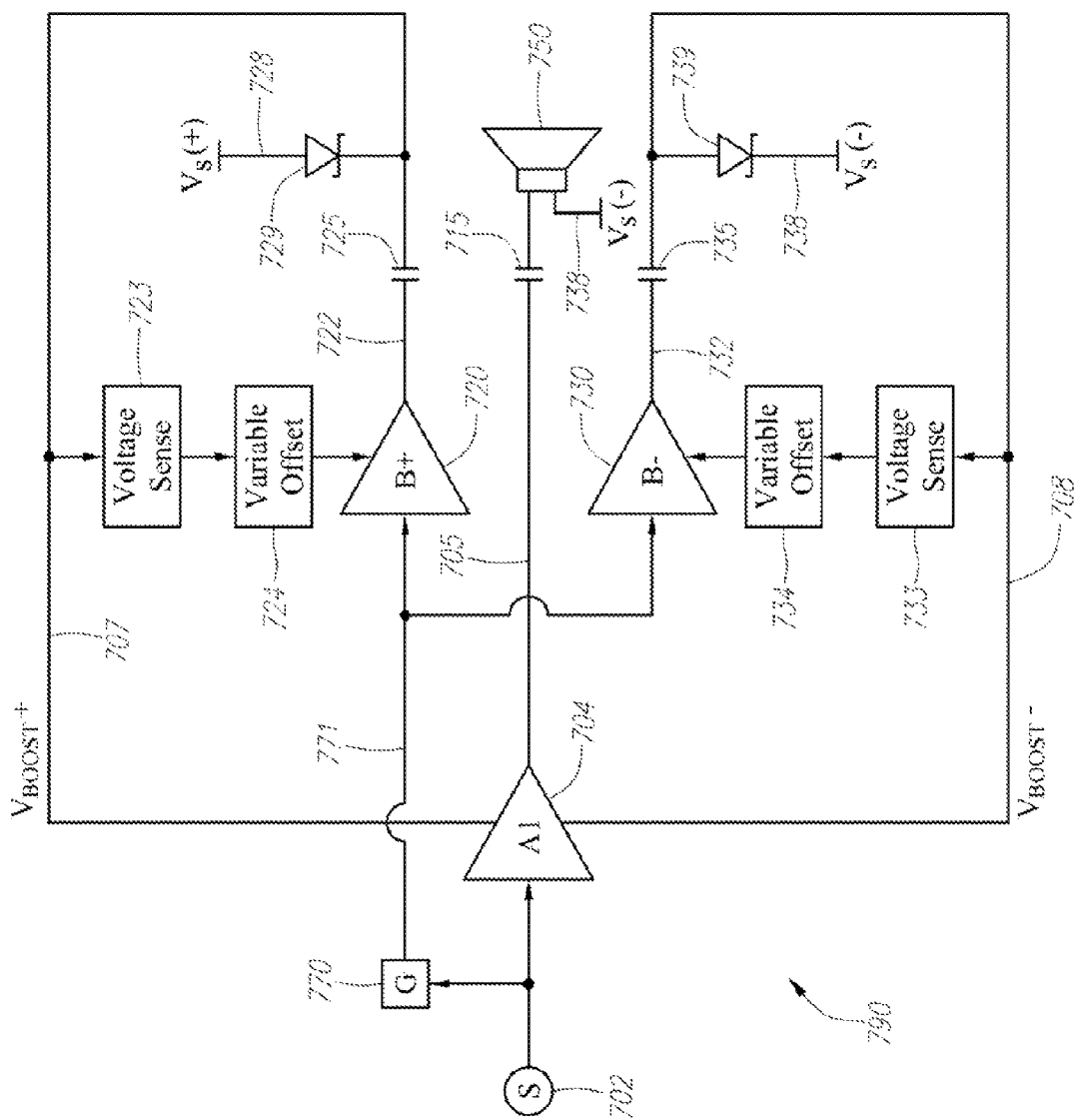
FIG. 7B depicts a variation of the amplifier of FIG. 7A which includes circuitry for sensing a difference between the supply voltage and an amplified version of the main amplifier input in order to drive the feedback loop.
Figure 8A:
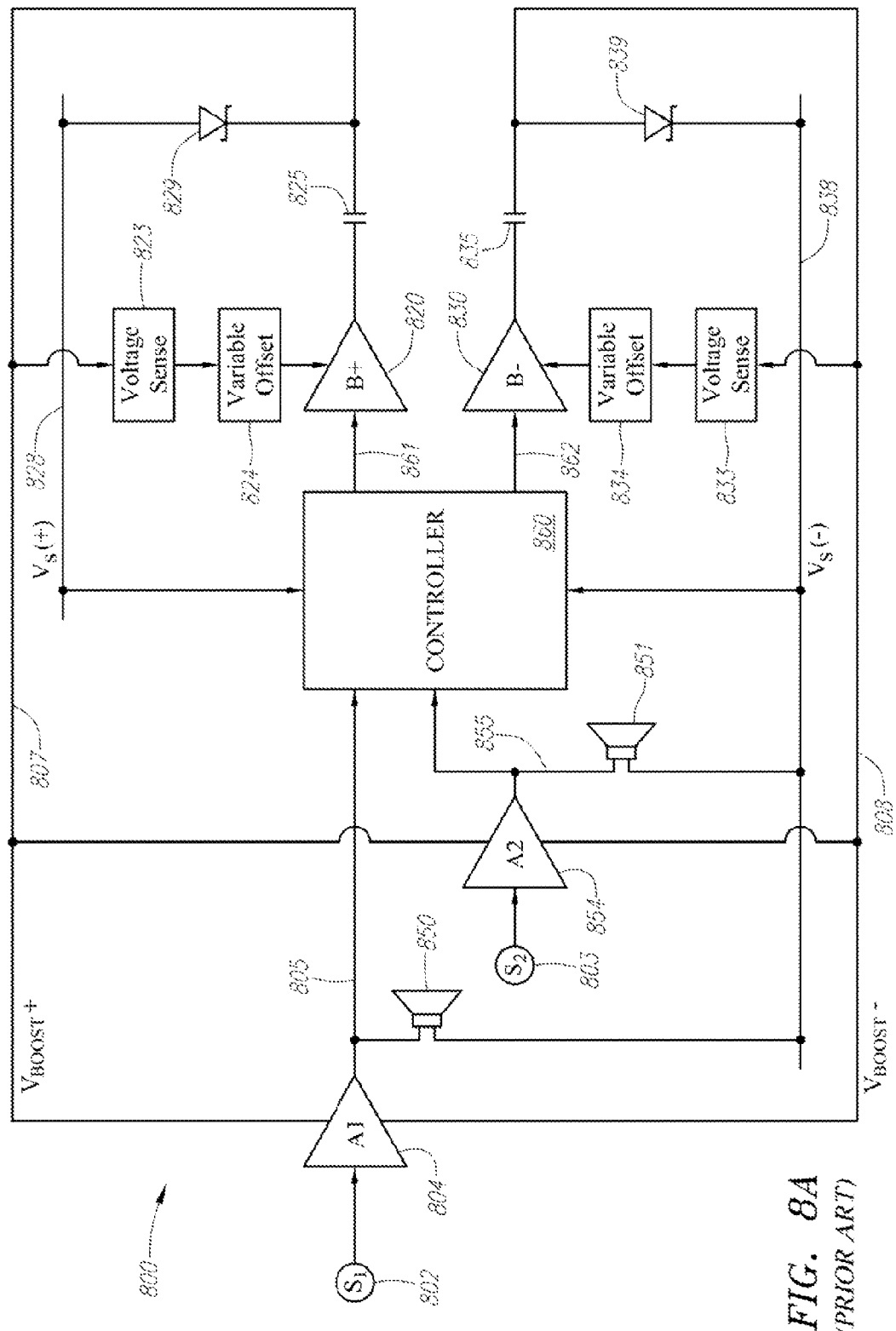
FIG. 8A is a diagram of a dual-channel power amplifier including power rail boost circuitry as known in the art, which adjusts for decay or droop.
Figure 8B:
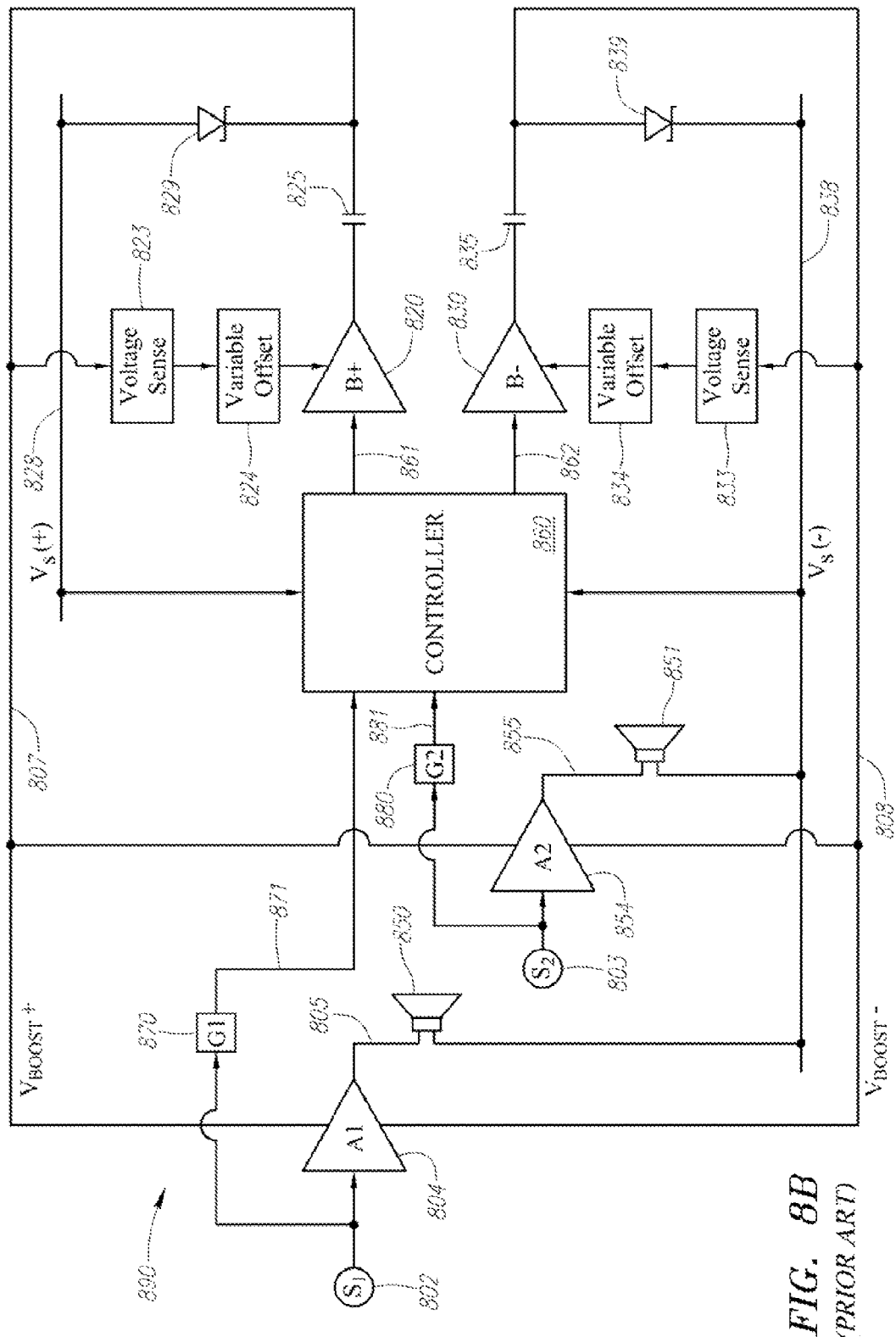
FIG. 8B depicts a variation of the amplifier of FIG. 8A which includes circuitry for sensing a difference between the supply voltage and an amplified version of the main amplifier input to drive the feedback loop.

A variation of the approach described with respect to FIGS. 7A and 8A is also known, whereby rather than sensing the difference between the supply voltage and the output of the main amplifier(s), the difference between the supply voltage and a suitably amplified version of the input to the main amplifier(s) is instead used to drive the feedback loop (see FIGS. 7B and 8B, corresponding to modified versions of FIGS. 7A and 8A respectively). Thus, in FIG. 7B, the power amplifier 790 includes a gain stage 770 having gain G for amplifying the input signal 702, and the amplified input signal 771 is provided to power boost amplifiers 720, 730 instead of the main amplifier output 705. Similarly, in FIG. 8B, the power amplifier 890 includes gain stages 870, 880 having gain factors G1, G2 respectively, for amplifying the input signals 802 and 803, and the amplified input signals 871 and 881 are provided to controller 860, which operates as previously described.

Figure 9:
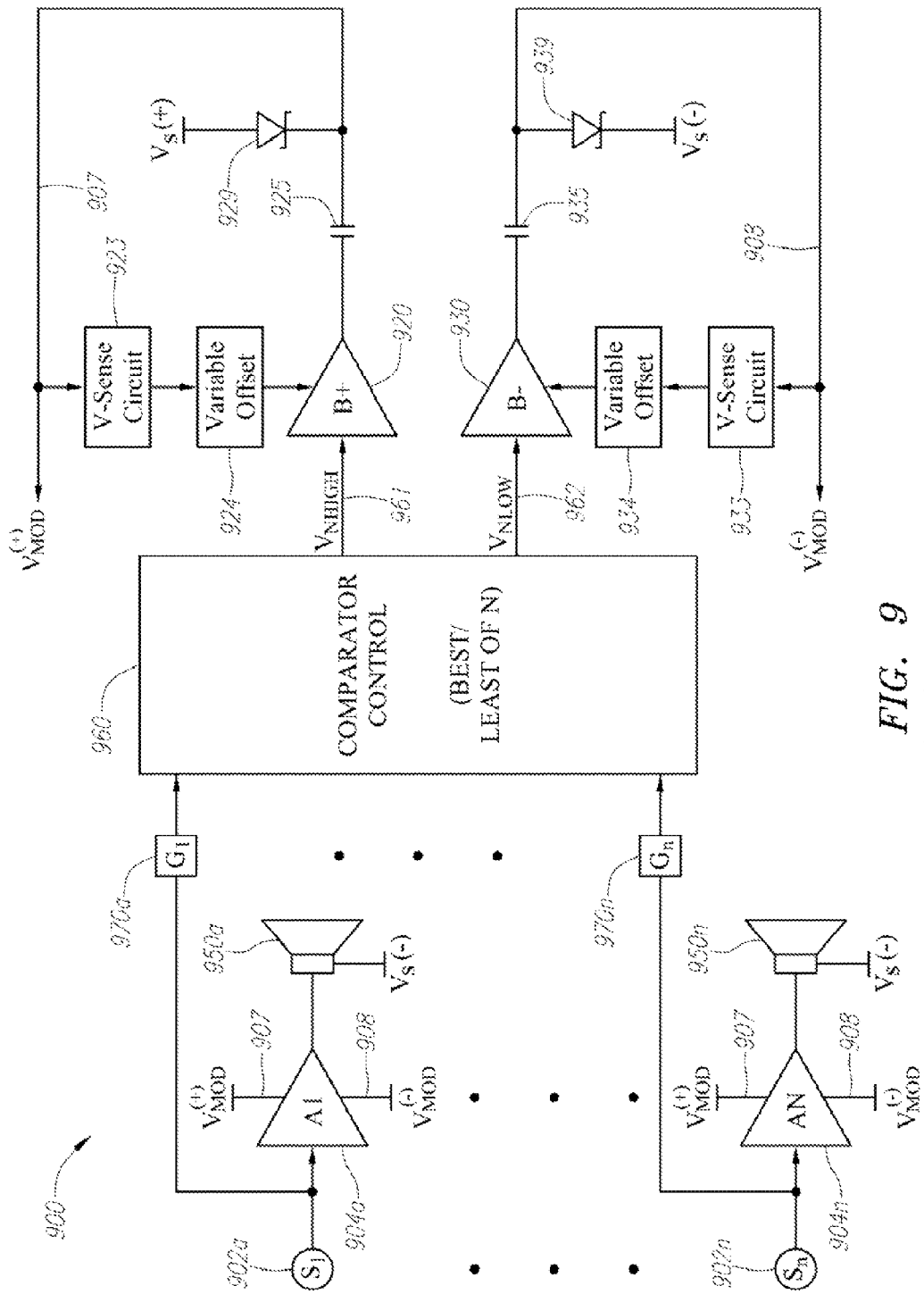
FIG. 9 is a diagram of an embodiment of an N-channel power amplifier including power rail boost circuitry as known in the art.

FIG. 9 shows an example of a tracking power supply as known in the art employing the feedback control approach of FIG. 8B expanded to the general case of N amplifiers 904*a* . . . *n*, still using one set of power boost amplifiers 920, 930. The amplification system in FIG. 9 includes a comparator control circuit 960 which determines the largest positive magnitude voltage ("best-of-N") from the various amplifier outputs 905*a* . . . *n*, and the largest negative magnitude voltage ("least-of-N") from the various amplifier outputs 905*a* . . . *n*, and provides these values (denoted $V_{NHIGH}$ and $V_{NLOW}$ in FIG. 9) to the power boost amplifiers 920, 930. The difference between the positive or negative supply voltages and the largest positive/negative output of any of the main amplifiers 904*a* . . . *n* in FIG. 9 is used to drive the feedback loop. In this way, it can be ensured that the power supply voltage is always large enough to prevent any of the main amplifiers 904*a* . . . *n* from clipping.

Further details of tracking amplifier systems as known in the art are described in U.S. Pat. No. 7,834,702, previously cross-referenced and incorporated herein by reference.

Figure 10:
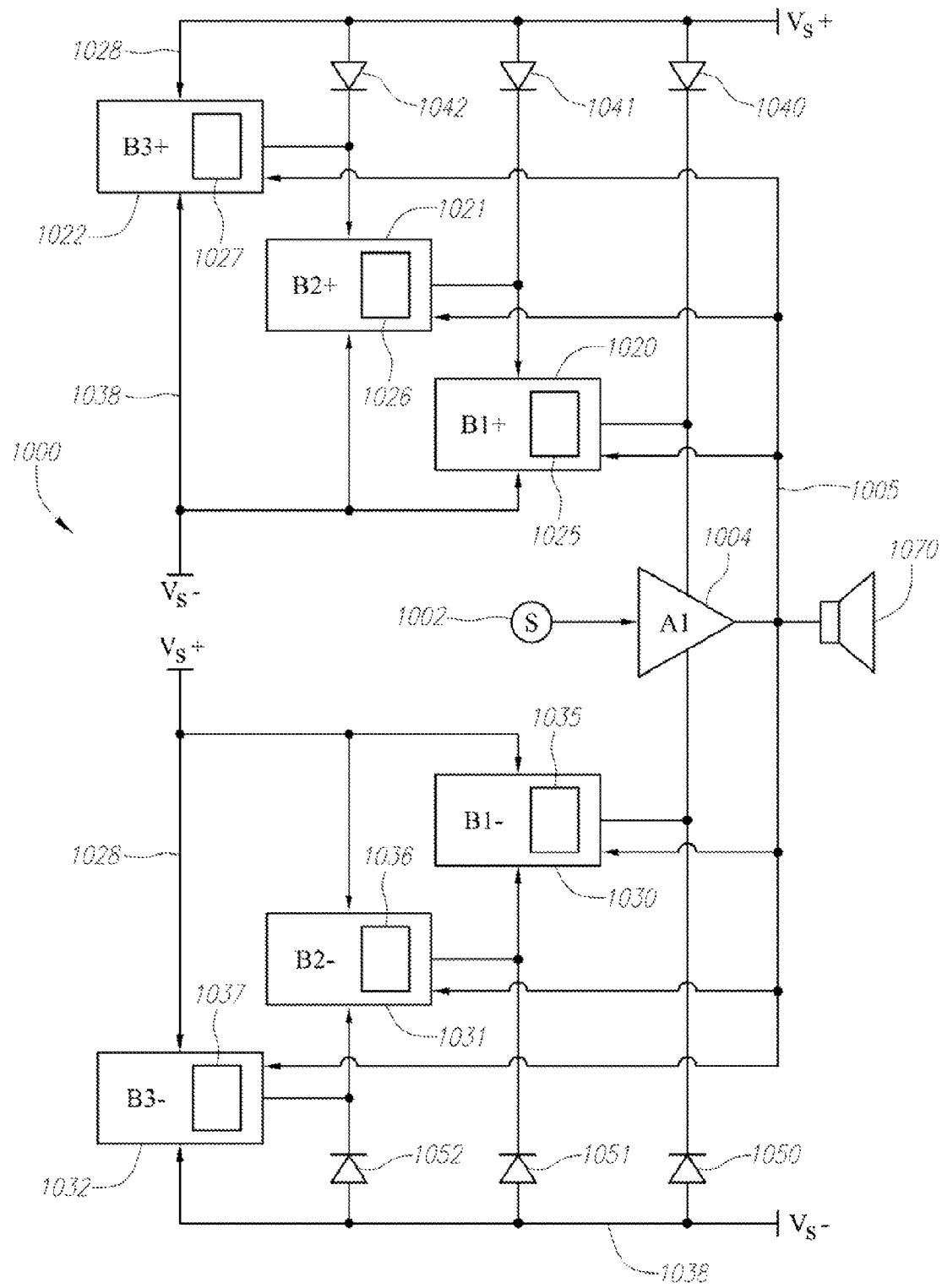
FIG. 10 is a block diagram of an embodiment of a tracking power supply with cascaded power boost circuitry, for use in conjunction with, e.g., a power amplifier.

FIG. 10 is a block diagram illustrating an embodiment of a cascaded or multi-stage power boost tracking amplifier 1000 in accordance with one exemplary arrangement as disclosed herein. Although FIG. 10 illustrates only a single-channel power amplifier, its principles are applicable to multi-channel amplifiers as well. As shown in FIG. 10, a main amplifier 1004 (denoted "A1") amplifies a source signal 1002. The main amplifier 1004 may be of any conventional design, although it preferably has a high power supply rejection ratio (PSRR). The main amplifier 1004 in this example is connected to a loudspeaker 1070 (optionally through a coupling capacitor, not shown) in a conventional manner. The main amplifier 1004 is coupled to the power supply lines 1028 (Vs+) and 1038 (Vs−) through diodes 1040 and 1050, respectively. Diodes 1040 and 1050 are preferably (but need not be) Schottky type diodes, or have similar characteristics thereto, so as to provide rapid switching time and to maximize the potential boost level.

As further illustrated in FIG. 10, the main amplifier 1004 is supplied by not only the power supply lines 1028, 1038 but also by power boost circuitry including a first set of cascaded boost circuits or stages 1020, 1021, 1022 (also denoted B1+, B2+, B3+) associated with the positive power supply line 1028, and a second set of cascaded boost circuits or stages 1030, 1031, 1032 (also denoted B1−, B2−, B3−) associated with the negative power supply line 1038. Although three power boost circuits are illustrated in FIG. 10 for each power supply line 1028, 1038, the same principles may be applied to a design having fewer (e.g., two) or more (e.g., four or more) power boost circuits. Therefore the concepts explained with respect to FIG. 10 as well as the other embodiments disclosed herein may be extrapolated to an arbitrary number of power boost circuits configured in a cascaded manner. As explained in more detail below, the cascaded sets of power boost circuits 1020, 1021, 1022 and 1030, 1031, 1032 operate so as to temporarily boost the positive and/or negative power supply inputs to the main amplifier 1004.

Each power boost circuit 1020, 1021, 1022 for the positive power supply line 1028 may provide a gain and a stored energy source 1025, 1026, 1027 (such as a capacitor or battery), and the power boost circuits 1020, 1021, 1022 are linked in a cascaded fashion to provide a greater degree of voltage boost to the positive power supply line 1028 when needed. Likewise, each power boost circuit 1030, 1031, 1032 for the negative power supply line 1038 may provide a gain and a stored energy source 1035, 1036, 1037 (such as a capacitor or battery), and the power boost circuits 1030, 1031, 1032 are linked in a cascaded fashion to provide a greater degree of voltage boost to the negative power supply line 1038 when needed. Diodes 1040, 1041, 1042 allow, among other things, the positive power supply line 1028 to be temporarily decoupled from the power supply inputs of the main amplifier 1004, first positive power boost circuit 1020 and second positive power boost circuit 1021, respectively, when the power supply inputs for each of those components is temporarily boosted. Likewise, diodes 1050, 1051, 1052 allow, among other things, the negative power supply line 1038 to be temporarily decoupled from the power supply inputs of the main amplifier 1004, first negative power boost circuit 1030 and second negative power boost circuit 1031, respectively, when the power supply inputs for each of those components is temporarily boosted.

Each of the power boost circuits 1020, 1021, 1022 and 1030, 1031, 1032 preferably monitors or tracks the output signal 1005 (or alternatively a representation thereof, such as an amplified version of the input signal 1002) from the main amplifier 1004 and provides a power boost, in seriatim, for either the positive power supply input of the negative power supply input to the main amplifier 1004 as the output signal 1005 increasingly rises towards the relevant supply rail.

In one example, the first power boost circuit 1020 activates when the output signal 1005 surpasses a first threshold (preferably configured to a value close to the fixed voltage of the positive supply power line 1028), and provides an additional boost to the positive power supply input of the main amplifier 1004. This allows the output signal 1005 to reach a level almost equal to three times the voltage of the positive supply power line 1028—because the first power boost circuit 1020 is capable of boosting by an amount equal to the spread between the positive and negative voltage rails. The second power boost circuit 1021 activates when the output signal 1005 surpasses a second threshold (preferably configured to a value close to three times the fixed voltage of the positive supply power line 1028), and provides an additional boost to the positive power supply input of the first power boost circuit 1020. The first power boost circuit 1020 in turn is thereby able to provide a similar additional boost to the main amplifier 1004, allowing the output signal 1005 to rise above the second threshold to a level equal to almost five times the voltage of the positive supply power line 1028. The third power boost circuit 1022 activates when the output signal 1005 surpasses a third threshold (preferably configured to a value close to five times the fixed voltage of the positive supply power line 1028), and provides an additional boost to the positive power supply input of the second power boost circuit 1021. The second power boost circuit 1021 in turn is thereby able to provide a similar additional boost to the first power boost circuit 1020, which in turn is thereby able to provide a similar additional boost to the main amplifier 1004. As a result, the output signal 1005 is permitted to rise above the third threshold to a level equal to almost seven times the voltage of the positive power supply line 1028.

In an analogous fashion, according to the same example, the first power boost circuit 1030 associated with the negative power supply line 1038 activates when the output signal 1005 surpasses a first negative threshold (preferably configured to a value close to the fixed voltage of the negative supply power line 1038), and provides an additional boost to the negative power supply input of the main amplifier 1004. This allows the output signal 1005 to reach a level, in the negative direction, almost equal to three times the voltage of the negative supply power line 1038. The second power boost circuit 1031 activates when the output signal 1005 surpasses a second negative threshold (preferably configured to a value close to three times the fixed voltage of the negative supply power line 1038), and provides an additional boost to the negative power supply input of the first power boost circuit 1030. The first power boost circuit 1030 in turn is thereby able to provide a similar additional boost to the main amplifier 1004, allowing the output signal 1005 to surpass the second negative threshold to a level equal to almost five times the voltage of the negative supply power line 1038. The third power boost circuit 1032 activates when the output signal 1005 surpasses a third negative threshold (preferably configured to a value close to five times the fixed voltage of the negative supply power line 1038), and provides an additional boost to the negative power supply input of the second power boost circuit 1031. The second power boost circuit 1031 in turn is thereby able to provide a similar additional boost to the first power boost circuit 1030, which in turn is thereby able to provide a similar additional boost to the main amplifier 1004. As a result, the output signal 1005 is permitted to go beyond the third negative threshold to a level equal to almost seven times the voltage of the negative power supply line 1038.

Consequently, in this example, the output signal 1005 is permitted to reach temporary peak values nearly seven times the normal fixed voltage level of the positive and negative supply lines 1028, 1038, leading to a substantial increase in the available signal range for the main amplifier 1004.

Figure 16:
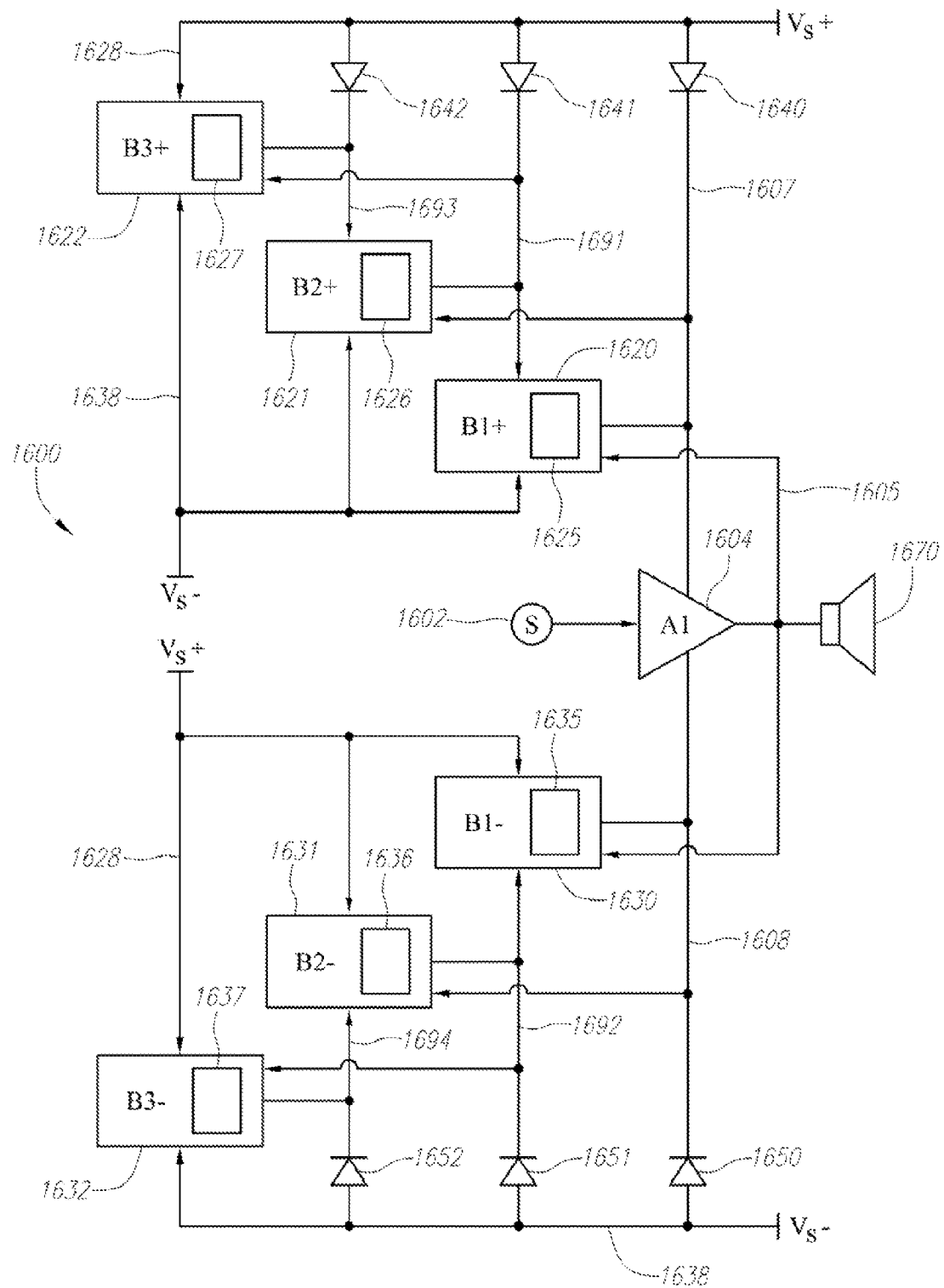
FIG. 16 is a block diagram of an alternative embodiment of a tracking power supply with cascaded power boost circuitry, where the output of each power boost stage is coupled to an input of the downstream power boost stage.

FIG. 16 is a block diagram of an alternative embodiment of a tracking power supply with cascaded power boost circuitry, where the output of each power boost stage is coupled to an input of the downstream power boost stage. In FIG. 16, elements numbered as "16xx" generally correspond to like-numbered elements "10xx" in FIG. 10. As with FIG. 10, the tracking power supply 1600 of FIG. 16 has a main amplifier 1604 selectively supplied by power supply lines 1628, 1638 and by power boost circuitry including a first set of cascaded boost circuits or stages 1620, 1621, 1622 (also denoted B1+, B2+, B3+) associated with the positive power supply line 1628, and a second set of cascaded boost circuits or stages 1630, 1631, 1632 (also denoted B1−, B2−, B3−) associated with the negative power supply line 1638. The tracking power supply 1600 of FIG. 16 operates similarly to that of FIG. 10, except that instead of the downstream positive power boost circuits 1621, 1622 (B2+, B3+) and negative power boost circuits 1631, 1632 (B2−, B3−) being responsive directly to the main amplifier output signal 1605, the second stage positive power boost circuit 1621 (B2+) reacts to the power supply output signal 1691 from the first stage positive power boost circuit 1620 (B1+), and the third stage positive power boost circuit 1622 (B3+) reacts to the power supply output signal 1693 from the second stage positive power boost circuit 1621 (B2+). Since the power supply output signals 1691 and 1693 are raised in conjunction with the main amplifier output signal 1605 but at different levels, the effect is similar to the downstream positive boost circuits 1621, 1622 responding to peak demands of the main amplifier output signal 1605.

Similarly, the second stage negative power boost circuit 1631 (B2−) reacts to the power supply output signal 1692 from the first stage negative power boost circuit 1630 (B1−), and the third stage negative power boost circuit 1632 (B3−) reacts to the power supply output signal 1694 from the second stage negative power boost circuit 1631 (B2−).

The cascaded power boost techniques illustrated in FIGS. 10 and 16 can be applied to a multiple amplifier environment similar to the one illustrated in FIG. 3, 4, 6, 8A, 8B or 9, for example. An optional control circuit (not shown) may be provided to monitor amplifier output signal levels, or individually amplified input signal levels for each of the amplifiers, and to provide power boost control signals to the various power boost circuits, which temporarily raise or lower the positive and/or negative supply voltages above or below the nominal voltage rails in tandem with the highest and lowest output signals, respectively, from the amplifier(s).

Figure 11:
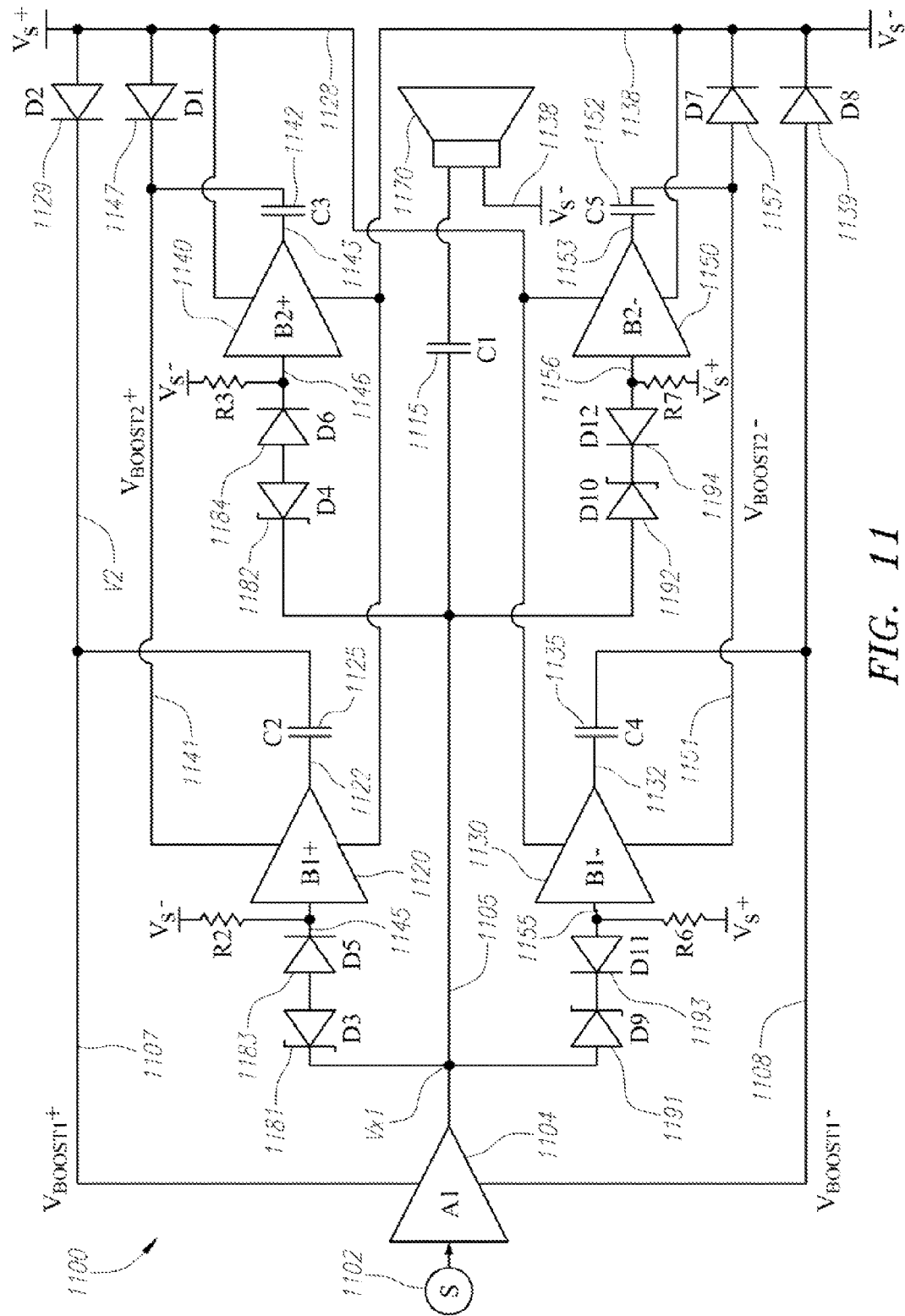
FIG. 11 is a diagram illustrating a tracking power supply with cascaded power boost rail circuitry in accordance with the principles illustrated in FIG. 10, according to one embodiment as disclosed herein.

FIG. 11 is a high-level diagram of a single-channel cascaded-boost power amplification system 1100 in accordance with one or more embodiments as disclosed herein, in general accordance with the principles of the cascaded power boost circuitry illustrated in FIG. 10, but showing additional implementation details in accordance with one representative embodiment. Although the design in FIG. 11 illustrates a cascade of only two power boost circuits for each of the positive and negative power supply lines, the principles are also applicable to, e.g., three or more cascaded power boost circuits (such as illustrated for example in FIG. 10). Moreover, although FIG. 11 illustrates only a single-channel power amplifier, its principles are applicable to multi-channel amplifiers as well.

As shown in the example of FIG. 11, a main amplifier 1104 (denoted "A1") amplifies a source signal 1102. The main amplifier 1104 may be of any conventional design, although it preferably has a high power supply rejection ratio (PSRR). The main amplifier 1104 in this example is connected to a load (e.g., loudspeaker 1170), optionally through a coupling capacitor 1115 ("C1"), in a generally conventional manner. In an embodiment where the other input 1138 of the load is connected to ground, for example, coupling capacitor 1115 may be dispensed with. The main amplifier 1104 is preferably coupled to the power supply lines 1128 (Vs+) and 1138 (Vs−) through diodes 1129 ("D2") and 1139 ("D8"), respectively. Diodes 1129 and 1139 are preferably Schottky type diodes, or have similar characteristics thereto, so as to provide rapid switching time and to maximize the potential boost level.

A first positive power boost amplifier 1120 (denoted "B1+" in part because it pertains to the positive supply voltage) associated with a first positive power boost circuit is preferably coupled to positive power supply line 1128 (Vs+) through diodes 1147 ("D1") and directly to negative power supply line 1138 (Vs−), from which sources the first positive power boost amplifier 1120 draws its power. A first negative power boost amplifier 1130 (denoted "B1−" in part because it pertains to the negative supply rail) associated with a first negative power boost circuit is preferably coupled directly to positive power supply line 1128 (Vs+) and to negative power supply line 1138 (Vs−) through diode 1157 ("D8"), from which sources the first negative power boost amplifier 1030 draws its power. The first positive and first negative power boost amplifiers 1120 and 1130 are respectively coupled to the power supply inputs 1107, 1108 (denoted Vboost1+ and Vboost1− in FIG. 11) of the main amplifier 1104 via reservoir capacitors 1125 ("C2") and 1135 ("C4"). Output signal 1122 from first positive power boost amplifier 1120 is at voltage level Vs− (the negative supply rail) when first positive power boost function is inactive, and output signal 1132 from first negative power boost amplifier 1130 is at voltage level Vs+ (the positive supply rail) when first negative power boost amplifier boost function is inactive. As a result, reservoir capacitor 1125 is normally fully charged when the first positive power boost function is not required, and has a capacitor voltage differential of (Vs+−Vs−−VD2), where VD2 is the voltage drop across D2. Likewise, the reservoir capacitor 1135 is normally fully charged when the first negative power boost function is not required, and has a capacitor voltage differential of (Vs+−Vs−−VD8), where VD8 is the voltage drop across D8. With a 14.4V power supply, the voltage across each of the reservoir capacitors 1125, 1135 would thus typically be about 13.9 Volts. In an alternative embodiment, reservoir capacitors 1125 ("C2") and 1135 ("C4") may be replaced with other stored energy sources, such as small batteries, or may include hybrids such as super-capacitors or ultra-capacitors.

A second positive power boost amplifier 1140 (denoted "B2+" in part because it pertains to the positive supply voltage) associated with a second positive power boost circuit and a second negative power boost amplifier 1150 (denoted "B2−" in part because it pertains to the negative supply rail) associated with a second negative power boost circuit are coupled to power supply lines 1128 (Vs+) and 1138 (Vs−), respectively. The second positive power boost amplifier 1140 is coupled to the power supply input 1141 (denoted Vboost2+ in FIG. 11) of the first positive power boost amplifier 1120 via reservoir capacitor 1142 ("C3"). The second negative power boost amplifier 1150 is coupled to the negative power supply input 1151 (denoted Vboost2− in FIG. 11) of the first negative power boost amplifier 1130 via reservoir capacitor 1152 ("C5"). Output signal 1143 from second positive power boost amplifier 1140 is at voltage level Vs− (the negative supply rail) when second positive power boost function is inactive, and output signal 1153 from second negative power boost amplifier 1150 is at voltage level Vs+ (the positive supply rail) when second negative power boost amplifier boost function is inactive. As a result, reservoir capacitor 1142 is normally fully charged when the second positive power boost function is not required, and has a capacitor voltage differential of (Vs+−Vs−−VD1), where VD1 is the voltage drop across diode 1147 ("D1"). Likewise, the reservoir capacitor 1152 is normally fully charged when the second negative power boost function is not required, and has a capacitor voltage differential of (Vs+−Vs−−VD7), where VD7 is the voltage drop across diode 1157 ("D7"). With a 14.4V power supply, the voltage across each of the reservoir capacitors 1142, 1152 would thus typically be about 13.9 Volts.

The first positive power boost amplifier 1120 and first negative power boost amplifier 1130 sense the output of the main amplifier 1104 through respective voltage offset networks comprising, in this example, zener diode 1181 ("D3") and diode 1183 ("D5") for the first positive power boost amplifier 1120, and zener diode 1191 ("D9") and diode 1193 ("D11") for the first negative power boost amplifier 1130. The zener diodes 1181 and 1191 preferably have reverse-bias voltages selected so that the respective first positive power boost amplifier 1120 and first negative power boost amplifier 1130 will activate as the main amplifier output signal 1105 approaches the positive power supply rail voltage or negative power supply rail voltage, respectively, within a predefined offset as previously described, taking into account the further voltage drop provided by diodes 1183 ("D5") and 1193 ("D11"). Thus, for example, the reverse-bias voltage of zener diode 1181 ("D3") may be selected to be around 12 Volts, so that first positive power boost amplifier 1120 activates at 5.4 Volts (considering an approximate 0.6V voltage drop across diode 1183 ("D5"), or about 1.3 Volts beneath the power supply input signal 1107 (Vboost+) or about 1.8 Volts beneath 7.2V nominal positive power supply rail (Vs+). Likewise, the reverse-bias voltage of zener diode 1191 ("D9") may also be selected to be around 12 Volts, so that first negative power boost amplifier 1130 activates at −5.4 Volts (considering an approximate 0.6V voltage drop across diode 1193 ("D11"), or about 0.1.3 Volts less than the negative power supply input signal 1108 (Vboost−) or 1.8 Volts less than the −7.2V nominal negative power supply rail (Vs−).

Similarly, the second positive power boost amplifier 1140 and second negative power boost amplifier 1150 sense the output of the main amplifier 1104 through respective voltage offset networks comprising, in this example, zener diode 1182 ("D4") and diode 1184 ("D6") for the second positive power boost amplifier 1140, and zener diode 1192 ("D10") and diode 1194 ("D12") for the second negative power boost amplifier 1150. The zener diodes 1182 and 1192 preferably have reverse-bias voltages selected so that the respective second positive power boost amplifier 1140 and second negative power boost amplifier 1150 will activate as the main amplifier output signal 1105 approaches three times the positive power supply rail voltage level or negative power supply rail voltage level, respectively, within a predefined offset as previously described, taking into account the further voltage drop provided by diodes 1184 ("D6") and 1194 ("D12"). Thus, for example, the reverse-bias voltage of zener diode 1182 ("D4") may be selected to be around 24.6 Volts, so that second positive power boost amplifier 1140 activates at 18.0 Volts (considering the voltage drop across diode 1184 ("D6"), or about 1.3 Volts beneath the level at which power boost amplifier 1120 would clip. The reverse-bias voltage of zener diode 1192 ("D10") may also be selected to be around 24.6 Volts, so that second negative power boost amplifier 1150 activates at −18.0 volts (considering the voltage drop across diode 1194 ("D12"), or about 1.3 Volts beneath the level at which power boost amplifier 1130 would clip).

The reverse-bias voltage value selected for the zener diodes 1181, 1182, 1191 and 1192 may depend on a number of factors, including the desired offset value, the accuracy and tolerance of the zener diode voltage ratings, the expected duration of peak signal levels, the anticipated voltage droop during sustained boosting, and the ready availability of commercial zener diodes with specified voltage ratings.

Instead of being tied to magnitude of the main amplifier output signal 1105, as shown in FIG. 11, the voltage offset networks for the second positive and negative power boost amplifiers 1140, 1150 may be tied to the positive power supply input signal 1107 and negative power supply input signal 1108, respectively, or else to the output signals 1122 and 1132 from the first positive and negative power boost amplifiers 1120, 1130—in general accordance with the block diagram of FIG. 16 described previously. In such a case, the value of zener diodes 1182 and 1192 would be selected so as to activate the second positive and negative power boost amplifiers 1140, 1150 as those signals approach within a certain threshold (e.g., 1.3 Volts) of where the first positive or negative power boost amplifier 1120, 1130 would clip. The overall effect would be largely the same, as the rise in the positive power supply input signal 1107 or negative power supply in put signal 1108 reflect a corresponding rise in the main amplifier output signal 1105. In this case, the zener diodes 1182 and 1192 may have a reverse-bias voltage of 12 Volts, for example, where connected to the output signals 1122, 1132 of the first positive or negative power boost amplifier 1120, 1130, or of 25.9 Volts where they are connected to the positive and negative power supply inputs 1107, 1108.

In operation, the first positive power boost amplifier 1122 and first negative power boost amplifier 1130 sense the output of the main amplifier 1104, and produce output signals 1122, 1132 that drive the power supply input signals 1107, 1108 of the main amplifier 1104 via reservoir capacitors 1125 ("C2") and 1135 ("C4"). The second positive power boost amplifier 1140 senses the output of the main amplifier 1104, and produces output signal 1143 that drives the power supply input signal 1141 of the first positive power boost amplifier 1120 via reservoir capacitor 1142 ("C3"), and second negative power boost amplifier 1150 senses the output of the main amplifier 1104, and produces second negative power boost amplifier output signal 1153 that drives the negative power supply input signal 1151 of the first negative power boost amplifier 1130 via reservoir capacitor 1152 ("C5").

Under quiescent conditions, the DC output voltage of the main amplifier 1104 generally lies halfway between the positive and negative power supply rails Vs+ and Vs−. When the required output of the main amplifier 1104 is less than the limits imposed by power supply rails Vs+ and Vs−, the amplification system 1100 operates as a conventional amplifier. In other words, the main amplifier 1104 draws power from the positive and negative supply lines 1128, 1138 via diodes D2 and D8, respectively, and the source signal 1102 is amplified by main amplifier 1104 in a conventional manner.

Also under quiescent conditions, the DC output voltage of the first positive power boost amplifier 1120 and second positive power boost amplifier 1140 at outputs 1122 and 1143, respectively, is substantially equal to Vs− due to the non-conduction of diodes 1181 ("D3"), 1182 ("D4"), 1183 ("D5"), and 1184 ("D6"), with the inputs to the first positive power boost amplifier 1120 and second positive power boost amplifier 1140 being kept at roughly Vs− via resistors R2 and R3 respectively. As a result, reservoir capacitor 1125 is charged at such time and has a capacitor voltage differential of (Vs+−Vs−−VD2), where VD2 is the voltage drop across diode 1129 ("D2"). Likewise, reservoir capacitor 1142 is charged at such time and has a capacitor voltage differential of (Vs+−Vs−−VD1), where VD1 is the voltage drop across diode 1147 ("D1").

Similarly, under quiescent conditions, the DC output voltage of the first negative power boost amplifier 1130 and second negative power boost amplifier 1150 at outputs 1132 and 1153, respectively, is substantially equal to Vs+ due to the non-conduction of diodes 1191 ("D9"), 1192 ("D10"), 1193 ("D11"), and 1194 ("D12"), with the inputs to the first negative power boost amplifier 1130 and second negative power boost amplifier 1150 being kept at roughly Vs+ via resistors R6 and R7 respectively. As a result, reservoir capacitor 1135 is charged and has a capacitor voltage differential of (Vs+−Vs−−VD8), where VD8 is the voltage drop across diode 1139 ("D8"). Likewise, reservoir capacitor 1152 is charged and has a capacitor voltage differential of (Vs+−Vs−−VD7), where VD7 is the voltage drop across diode 1157 ("D7").

When the required output of the main amplifier 1104 is less than the limits imposed by power supply rails Vs+ and Vs−, the amplification system 1100 operates as a conventional amplifier. In other words, the main amplifier 1104 draws power from the positive and negative supply lines 1128, 1138 via diodes D2 and D8 respectively, and the source signal 1102 is amplified by main amplifier 1104 in a conventional manner.

However, when the source signal 1102 reaches amplitudes requiring that the main amplifier output signal 1105 approach or exceed the power supply rails 1128 (Vs+) and/or 1138 (Vs−), the operation of the amplification system 1100 changes to allow increased power output. The main amplifier 1104 normally derives current from the power supply rails Vs+ and Vs− via diodes 1129 and 1139 (D2 and D8), and delivers power to the load, e.g., the loudspeaker 1170. Thus, the maximum peak-to-peak output voltage under ordinary conditions, without the effect of the power boost circuitry, is generally given by the equation: (Vs+−Vs−)−(VD1+VD2); that is, the maximum peak-to-peak output voltage is the difference between the positive and negative supply rails less the voltage drops caused by diodes 1129, 1139. In the amplification system 1100, as the output voltage from the main amplifier 1104 approaches the positive or negative supply rail, power boost amplifier 1120 or 1130 (depending upon the polarity of the signal) will force a temporary increase to power supply input signal(s) 1107 and/or 1108 as needed, allowing an increase in the voltage swings of the main amplifier output signal 1105.

The power boost operation of amplification system 1100 will now be explained in greater detail, taking first the example where the source signal 1102 is positive and will require a boost in the positive power supply input 1107. As main amplifier output signal 1105 approaches the positive supply rail Vs+ within a certain range (such as 1.3 Volts) of Vs+, or surpasses a first positive threshold, the voltage offset network comprised of zener diode D3 and diode D5 starts to conduct, and the input 1145 to the first positive boost amplifier 1120 starts to follow the output of main amplifier 1104. As a result, the output 1122 of first positive power boost amplifier 1120 (B1+) starts to rise up from its quiescent state, which is at Vs− potential. As previously noted, in its quiescent state the first power boost amplifier 1120 has charged up reservoir capacitor 1125 (C2) to a voltage of (Vs+−VD2). The rise in output signal 1122 caused by the rise in main amplifier output signal 1105 is transferred via the reservoir capacitor 1125 (C2) to the positive power supply input 1107 of the main amplifier 1104, raising its potential (Vboost1+). As this occurs, diode 1129 (D2) is cut off so that the positive power supply input 1107 of main amplifier 1104 becomes isolated from the positive power supply rail Vs+ and, instead, main amplifier 1104 input current is derived from the output of first positive power boost amplifier 1120 (B1+) via reservoir capacitor 1125 (C2). The main amplifier output signal 1105 is thus no longer limited by the positive power supply rail Vs+.

If the first positive power boost amplifier 1120 (B1+) has unity gain, for example, then the voltage level of positive power supply input 1107 to main amplifier 1104 tracks the main amplifier 1104 output voltage, albeit with an offset of some amount, so that the difference between the voltage level of the main amplifier output signal 1105 and its supply voltage, Vboost1+, is held relatively constant at, e.g., approximately 1.3 Volts. Thus the main amplifier output signal 1105 is permitted to rise above the first threshold and the positive power supply voltage Vs+ while preventing saturation and/or clipping.

This manner of operation may continue until the output 1122 of first positive power boost amplifier 1120 reaches close to the positive rail voltage Vs+, corresponding to the point where the output of the main amplifier approaches three times the level of the positive rail voltage Vs+. Thus, as the output signal 1122 from the first positive power boost amplifier 1120 approaches the positive supply rail Vs+ within a certain range (typically 1.3 Volts) of Vs+, or put otherwise, as the main amplifier output signal 1105 surpasses a second positive threshold just below 3 Vs+, the voltage offset network comprised of zener diode D4 and diode D6 begin to conduct and the input 1146 to the second positive boost amplifier 1140 starts to follow the output of first positive power boost amplifier 1120. As a result, the output 1143 of second positive power boost amplifier 1140 (B2+) starts to rise up from its quiescent state, which is at Vs− potential. As previously noted, in its quiescent state the second positive power boost amplifier 1140 has charged up reservoir capacitor 1142 (C3) to a voltage of (Vs+−VD1). The rise in output signal 1143 caused by the rise in main amplifier output signal 1105 is transferred via the reservoir capacitor 1142 (C3) to the positive power supply input 1141 of the first positive power boost amplifier 1120, raising its potential (Vboost2+). As this occurs, diode 1147 (D1) is cut off so that the positive power supply input 1141 of first positive power boost amplifier 1120 becomes isolated from the positive power supply rail Vs+ and, instead, its input is derived from the output of second positive power boost amplifier 1140 (B2+) via reservoir capacitor 1142 (C3). The first positive power boost amplifier output signal 1122 is thus no longer limited by the positive power supply rail Vs+.

In a cascade effect, the rise in output signal 1122 past positive power supply rail Vs+ caused by the rise in main amplifier output signal 1105 is transferred via the reservoir capacitor 1125 (C2) to the positive power supply input 1107 of the main amplifier 1104, raising its potential (Vboost1+). Diode 1129 (D2) remains cut off so that the positive power supply input 1107 of main amplifier 1104 continues to be isolated from the positive power supply rail Vs+ and, instead, main amplifier 1104 input current is derived from the output of first positive power boost amplifier 1120 (B1+) via reservoir capacitor 1125 (C2). Thus the main amplifier output signal 1105 is now permitted to rise above 3 Vs+ while preventing saturation and/or clipping. By contrast, in prior tracking systems employing a similar concept such as shown in FIG. 1, the maximum voltage boost would be roughly 2 Vs+ above the supply rail level.

The foregoing manner of operation may continue until the output 1143 of second positive power boost amplifier 1140 reaches the positive rail voltage Vs+ and clips. The positive power supply input 1141 (Vboost2+) of the first positive power boost amplifier 1120 then rises no further, and the output 1122 of the first positive power boost amplifier 1120 can then only rise slightly higher until it too clips at a final potential of (3 Vs+−VD1). The main amplifier's positive power supply input 1107 (Vboost1+) then rises no further, and main amplifier output signal 1105 can then only rise slightly higher until it too clips at a final potential of (5 Vs+−VD2).

When main amplifier output signal 1105 swings the other direction, i.e., negative, then a similar effect occurs with first negative power boost amplifier 1130 (B1−), reservoir capacitor 1135 (C4), and diode 1139 (D8). These components act in a similar manner to the positive supply components, but instead move the negative power supply input 1108 (Vboost1−) below the potential of the negative supply rail Vs−. This manner of operation may continue until the output 1132 of first negative power boost amplifier 1130 reaches the negative rail voltage Vs−.

Thus in more detail, as main amplifier output signal 1105 approaches the negative supply rail Vs− within a certain range (such as 1.3 Volts) of Vs−, or surpasses a first negative threshold, the voltage offset network comprised of zener diode D9 and diode D11 starts to conduct, and the input 1155 to the first negative boost amplifier 1130 starts to follow the output of main amplifier 1104. As a result, the output 1132 of first negative power boost amplifier 1130 (B1−) starts to increase (in a negative direction) from its quiescent state, which is at Vs+ potential. As previously noted, in its quiescent state the first negative power boost amplifier 1130 has charged up reservoir capacitor 1135 (C4) to a voltage of (Vs−+VD8). The rise in output signal 1132 caused by the rise in main amplifier output signal 1105 is transferred via the reservoir capacitor 1135 (C4) to the negative power supply input 1108 of the main amplifier 1104, raising its potential (Vboost1−). As this occurs, diode 1139 (D8) is cut off so that the negative power supply input 1108 of main amplifier 1104 becomes isolated from the negative power supply rail Vs− and, instead, main amplifier 1104 input current is derived from the output of first negative power boost amplifier 1130 (B1−) via reservoir capacitor 1135 (C4). The main amplifier output signal 1105 is thus no longer limited by the negative power supply rail Vs−.

If the first negative power boost amplifier 1130 (B1−) has unity gain, for example, then the voltage level of negative power supply input 1108 to main amplifier 1104 tracks the voltage level of the main amplifier output signal 1105, albeit with an offset of some amount, so that the difference between the voltage level of the main amplifier output signal 1105 and its negative supply voltage, Vboost1−, is held relatively constant at, e.g., approximately 1.3 Volts. Thus the main amplifier output signal 1105 is permitted to fall below the first negative threshold and the negative power supply voltage Vs− while preventing saturation and/or clipping.

As the output signal 1132 from the first negative power boost amplifier 1130 approaches the negative supply rail Vs− within a certain range (typically 1.5 Volts) of Vs−, which generally corresponds to the output signal 1105 of the main amplifier 1104 approaching three times the voltage level of the negative supply rail Vs− or surpassing a second negative threshold, then the voltage offset network comprised of zener diode D10 and diode D12 begins to conduct and the input 1156 to the second negative boost amplifier 1150 starts to follow the output of first negative power boost amplifier 1130. As a result, the output 1153 of second negative power boost amplifier 1150 (B2−) starts to increase (in a negative direction) from its quiescent state, which is normally at Vs+ potential. As previously noted, in its quiescent state the second negative power boost amplifier 1150 has charged up reservoir capacitor 1152 (C5) to a voltage of (−Vs−+VD7), where VD7 is the drop in voltage across diode 1157 (D7). The fall in second negative power boost amplifier output signal 1153 caused by the fall in main amplifier output signal 1105 is transferred via the reservoir capacitor 1152 (C5) to the negative power supply input 1151 of the first negative power boost amplifier 1130, lowering its potential below the negative supply rail (Vs−). As this occurs, diode 1157 (D7) is cut off so that the negative power supply input 1151 of first negative power boost amplifier 1130 becomes isolated from the negative power supply rail Vs− and, instead, its input is derived from the output of second negative power boost amplifier 1150 (B2−) via reservoir capacitor 1152 (C5). The first negative power boost amplifier output signal 1132 is thus no longer limited by the negative power supply rail Vs−.

The fall in output signal 1132 past negative power supply rail Vs− caused by the fall in main amplifier output signal 1105 is transferred via the reservoir capacitor 1135 (C4) to the negative power supply input 1108 of the main amplifier 1104, lowering its potential (Vboost1−). Diode 1139 (D8) remains cut off so that the negative power supply input 1108 of main amplifier 1104 continues to be isolated from the negative power supply rail Vs− and, instead, main amplifier 1104 input current is derived from the output of first negative power boost amplifier 1130 (B1−) via reservoir capacitor 1135 (C4). Thus main amplifier output signal 1105 is permitted to fall below the level of 3 Vs− while preventing saturation and/or clipping.

This manner of operation may continue until the output 1153 of second negative power boost amplifier 1150 reaches the negative rail voltage Vs− and clips. The first negative power boost amplifier 1130 negative power supply input 1151 (Vboost2−) then falls no further, and the output 1132 of the first negative power boost amplifier 1130 can then only fall slightly lower until it too clips at a final potential of (3 Vs−+VD7). The main amplifier's negative power supply input 1107 (Vboost1−) then falls no further, and main amplifier output signal 1105 can then only fall slightly lower until it too clips at a final potential of (5 Vs−+VD8).

It may be thus seen that both the positive and negative power supply inputs 1107 and 1108 of main amplifier 1104 can be independently boosted, with the positive power supply input 1107 being boosted by cascaded first and second positive power boost amplifiers 1120, 1140 above the positive supply rail Vs+, and the negative power supply input 1108 being boosted by cascaded first and second negative power boost amplifiers 1130, 1150 below the negative supply rail Vs−. This effect provides, in this example, a five times larger voltage swing capability to the main amplifier 1104 than it would have with no power boost circuitry.

Figure 12:
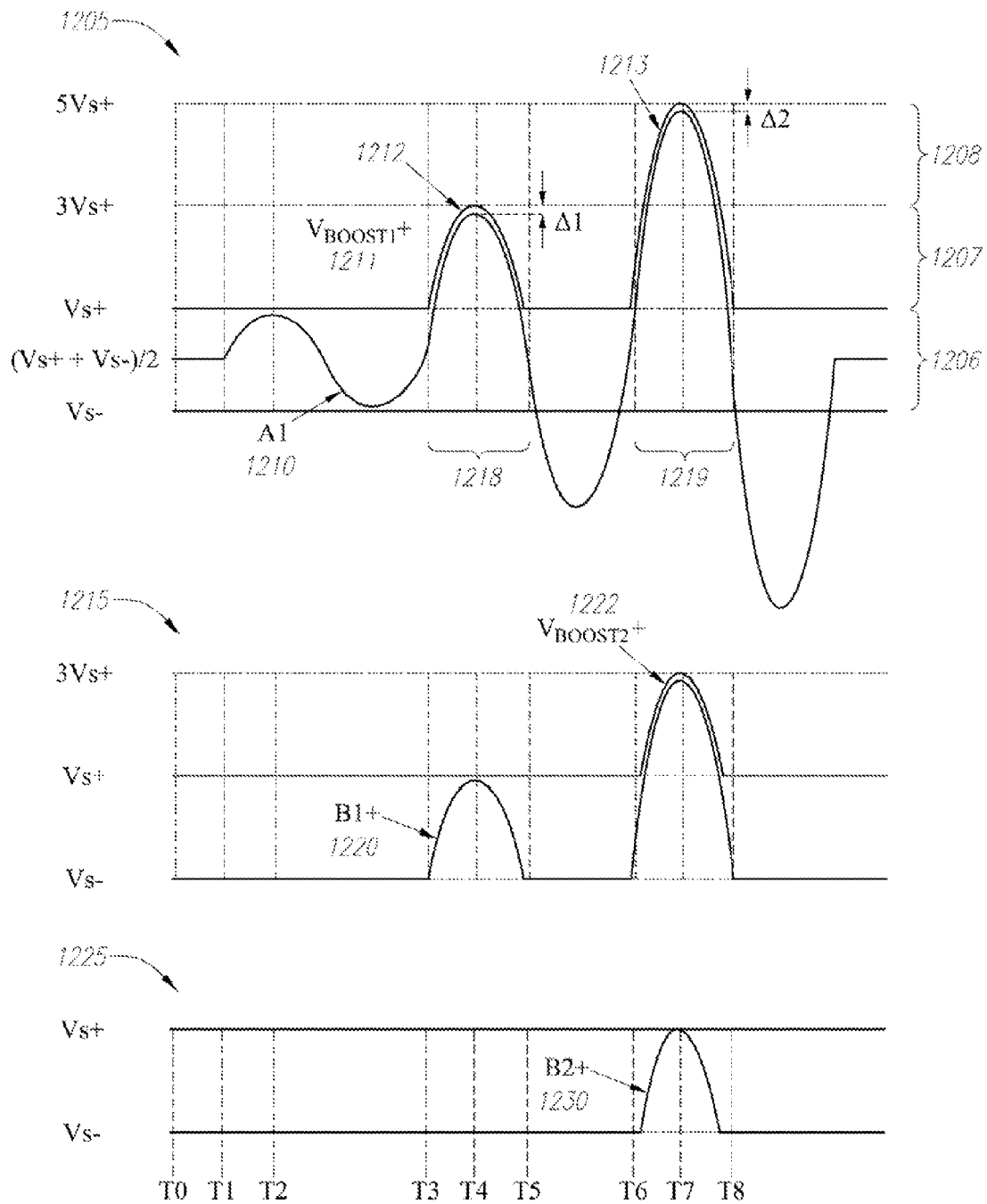
FIG. 12 illustrates a set of graphs illustrating an example of certain voltage waveforms and relationship pertaining to operation of the power boost circuitry of FIG. 11.

Further explanation of the operation of the amplification system 1100 of FIG. 11 may be made with reference to FIG. 12, which shows a related set of graphs illustrating various simplified waveforms according to one particular example. In FIG. 12, the topmost graph 1205 illustrates the output of the main amplifier A1 as illustrated by signal waveform 1210, and also shows various boost signals during signal peaks 1212, 1213, associated with the positive power boost signal 1211 provided to the positive supply input of the main amplifier A1 (with the negative power boost circuitry working in an analogous manner). Also shown in FIG. 12 are graphs 1215 and 1225 showing the operation of first and second cascaded power boost circuits according to this example. The signal waveform 1210 thus represents the output 1105 of the main amplifier 1104 in FIG. 11, the solid waveform line 1220 (also denoted "B1+") represents the output signal 1122 from the first positive power boost amplifier 1120 in FIG. 11, and the solid waveform line 1230 (also denoted "B2+") represents the output signal 1143 from the second positive power boost amplifier 1140 in FIG. 11. Signals 1211 and 1222 (also denoted as Vboost1+ and Vboost2+) respectively represent the power supply input signals 1107, 1141 having the same designations in FIG. 11.

As shown in FIG. 12, during the time period T0-T1 representing quiescent conditions, the first positive power boost amplifier output 1220 (waveform B1+) in graph 1215 and second positive power boost amplifier output 1230 (waveform B2+) in graph 1225 are at Vs− potential, the main amplifier power supply input 1211 (waveform Vboost1+) in graph 1205 and first positive power boost amplifier power supply input 1222 (waveform Vboost2+) in graph 1215 are at Vs+ potential, and main amplifier output signal 1210 (waveform A1) is at (Vs++Vs−)/2 potential. Where Vs+ and Vs− are equal in magnitude but have opposite polarities, the main amplifier output signal 1210 would be at ground potential during the time period T0-T1.

At time period T1, the main amplifier output signal 1210 begins to vary. During the entire time period from T0-T3, main amplifier output signal 1210 (waveform A1) stays between positive supply rail voltage, also denoted Vs+, and negative supply rail voltage, also denoted Vs−, and waveforms B1+, B2+, Vboost1+, and Vboost2+ continue to remain at quiescent voltage levels as no power boost is yet needed.

In period T3-T4, as main amplifier output signal 1210 (waveform A1) approaches the positive supply rail voltage Vs+ and eventually reaches a first peak 1212 less than 3 Vs+, the voltage offset network diodes D3 and D5 conduct and input 1145 to the first positive boost amplifier 1120 starts to follow main amplifier output signal 1210 (waveform A1). First positive power boost amplifier output signal 1220 (waveform B1+) therefore rises and main amplifier power supply input signal 1211 (waveform Vboost1+) tracks and stays above waveform A1 by some offset amount equal or corresponding to, for example, offset 41. Thus, the main amplifier output signal 1210 (waveform A1) is prevented from clipping and can continue to rise.

For time period T4-T5, as main amplifier output signal 1210 (waveform A1) falls, the main amplifier power supply input signal 1211 (waveform Vboost1+) follows until waveform Vboost1+ is once again at potential equal to the positive power supply rail Vs+, at which point waveform Vboost1+ is again clamped by the conduction of diode D2. As the voltage level of the main amplifier output signal 1210 (waveform A1) falls further, the first positive power boost amplifier output signal 1220 (waveform B1+) falls towards Vs− potential, thereby recharging capacitor C2.

During time period T6-T8, as the level of the main amplifier output signal 1210 (waveform A1) exceeds a potential of 3 Vs+ and approaches a second peak 1213 beyond that level, the level of the first positive power boost amplifier output signal 1220 (waveform B1+) needs to correspondingly rise above the Vs+ in order to adequately supply the main amplifier 1204. Accordingly, as the main amplifier output signal 1210 rises during time period T6-T8, the voltage offset network diodes D4 and D6 start to conduct and cause the second positive power boost amplifier output signal 1230 (waveform B2+) to rise in tandem with the output from the first positive power boost amplifier output signal 1220, offset by some threshold amount equal or corresponding to, for example, offset Δ2. This action increases first positive power boost amplifier power supply input 1222 (waveform Vboost2+), which prevents the first positive power boost amplifier output signal 1220 (waveform B1+) from clipping and allows the main amplifier power supply input 1211 (waveform Vboost1+) to continue increasing, thereby preventing main amplifier output signal 1210 (waveform A1) from clipping as well. This action continues until the level of the second positive power boost amplifier output signal 1230 (waveform B2+) clips at a potential of Vs+, at which point there is no greater output available from first positive power boost amplifier output signal 1220 (waveform B1+) or main amplifier output signal 1210 (waveform A1), and the waveform A1 finally clips at a positive output voltage of 5 Vs+.

In a practical implementation, as noted, there may be some droop or decay of the offset level over time, and previously described embodiments described herein are addressed to techniques for mitigating the effect of any droop or decay.

The power boost for the cascaded negative power boost circuits 1130, 1150 operates in an analogous manner. Thus, when the voltage level of main amplifier output signal 1210 (waveform A1) approaches the negative supply rail voltage, denoted Vs−, the negative power supply input signal 1108 (Vboost1−) tracks it and stays beyond the output signal level by some offset amount, such as offset Δ1, possibly subject to potential decay or droop as previously described herein. When the voltage level of main amplifier output signal 1210 (waveform A1) approaches three times the negative supply rail voltage (3 Vs−), the negative power supply input signal 1108 (Vboost1−) continues to track it and stays beyond the output signal level by some offset amount, such as offset 41, while the second power boost amplifier 1150 tracks the negative power supply input signal 1108 and raises the negative power supply input signal 1151 (Vboost2−) to the first power boost amplifier 1130 such that it stays above the negative power supply input signal 1108 by some amount, such as offset 42. This action continues until the second negative power boost amplifier output signal 1153 clips at a potential of Vs−, at which point main amplifier output signal 1210 clips at a negative output voltage of 5 Vs−. In a practical implementation, as noted, there may be some droop or decay of the offset level over time, and previously described embodiments described herein are addressed to techniques for mitigating the effect of any droop or decay.

It will be understood and appreciated by those skilled in the art that a variety of variations and alternative circuit arrangements may be made utilizing the same principles as reflected in FIG. 11, in order to achieve a similar result, and such variations and alternatives are embraced within the inventive concepts disclosed herein. For example, although the amplification system 1100 of FIG. 11 is shown with the input signal 1146 to the second positive power boost amplifier 1140 being driven from the main amplifier output signal 1105, it could instead be driven from first positive power boost amplifier output signal 1122, with the voltage offset network of zener diode D4 and diode D6 having an offset potential of Vs+. A similar arrangement could also be utilized for the input signal 1156 to the second negative power boost amplifier 1150.

Also, concepts utilized in connection with previously described embodiments herein addressed to feedback network arrangements for detecting and preventing the onset of clipping in amplifiers can also be used with the amplification system 1100 of FIG. 11, with suitable modification if necessary to accommodate for the cascaded power boost circuitry arrangement.

As previously indicated, consistent with the explanation of FIG. 10 herein, additional power boost circuits can be cascaded in a like manner, thereby increasing the power boost range of the overall system. In some cases, depending upon the circumstances and the needs of the system, power boost circuitry may be provided only for the positive supply rail but not the negative supply rail, or vice versa.

Figure 13:
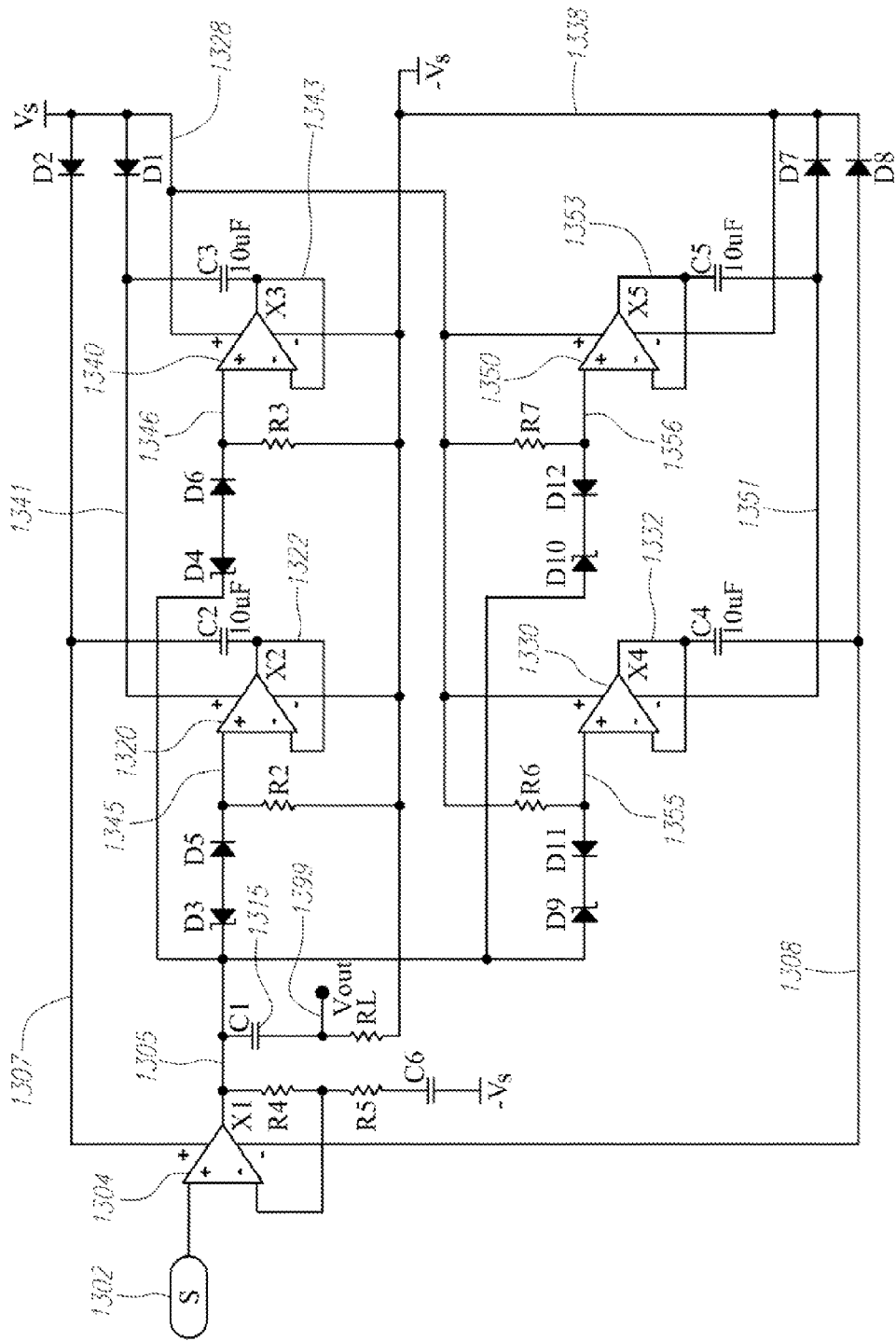
FIG. 13 is a circuit schematic diagram illustrating one possible implementation of the tracking power supply illustrated in FIG. 11.

Additional circuit details of a particular implementation consistent with the principles of FIG. 11 are illustrated in FIG. 13, which depicts a single-channel cascaded-boost power amplification system 1300 in accordance with one representative embodiment. Although FIG. 13 illustrates only a single-channel power amplifier, its principles are applicable to multi-channel amplifiers as well.

In general, elements labeled as "13xx" in FIG. 13 correspond to like elements labeled "11xx" in FIG. 11. Thus, as shown in the example of FIG. 13, a main amplifier 1304 (denoted "A1") amplifies a source signal 1302. The main amplifier 1304 may be of any conventional design, although, as previously noted, it preferably has a high power supply rejection ratio (PSRR). The main amplifier 1304 has an output signal 1399 which may be connected, for example, to a loudspeaker (not shown), optionally through a coupling capacitor 1315 ("C1"). As with FIG. 11, the main amplifier 1304 is preferably coupled to the power supply lines 1328 (Vs+) and 1338 (Vs−) through diodes D2 and D8, respectively. The power supply inputs of the first positive power boost amplifier 1320 (B1+) associated with the first positive power boost circuit are preferably coupled to positive power supply line 1328 (Vs+) through diode D1 and directly to negative power supply line 1338 (Vs−), from which the first positive power boost amplifier 1320 draws its power. The power supply inputs of the first negative power boost amplifier 1330 (B1−) associated with the first negative power boost circuit are preferably coupled directly to positive power supply line 1328 (Vs+) and to negative power supply line 1338 (Vs−) through diode D8, from which the first negative power boost amplifier 1030 draws its power. The first positive and first negative power boost amplifiers 1320 and 1330 are respectively coupled to the power supply inputs 1307, 1308 (denoted Vboost1+ and Vboost1− in FIG. 13) of the main amplifier 1304 via reservoir capacitors C2 and C4 respectively.

The power supply inputs of the second positive power boost amplifier 1340 (B2+) associated with the second positive power boost circuit and the second negative power boost amplifier 1350 (B2−) associated with the second negative power boost circuit are coupled to power supply lines 1328 (Vs+) and 1338 (Vs−), respectively. The second positive power boost amplifier 1340 is coupled to the power supply input 1341 (Vboost2+) of the first positive power boost amplifier 1320 via reservoir capacitor C3. The second negative power boost amplifier 1350 is coupled to the negative power supply input 1351 (Vboost2−) of the first negative power boost amplifier 1330 via reservoir capacitor C5.

In operation, the circuit of FIG. 13 operates in generally the same way as previously described with respect to the circuit of FIG. 11, thus providing up to five times the voltage swing normally available to the main amplifier 1304.

While the embodiments shown in FIGS. 11 and 13 use zener diodes to provide voltage offset networks, in alternative embodiments, other voltage reference circuits may be utilized, without departing from the scope and spirit of the invention.

Figure 14A:
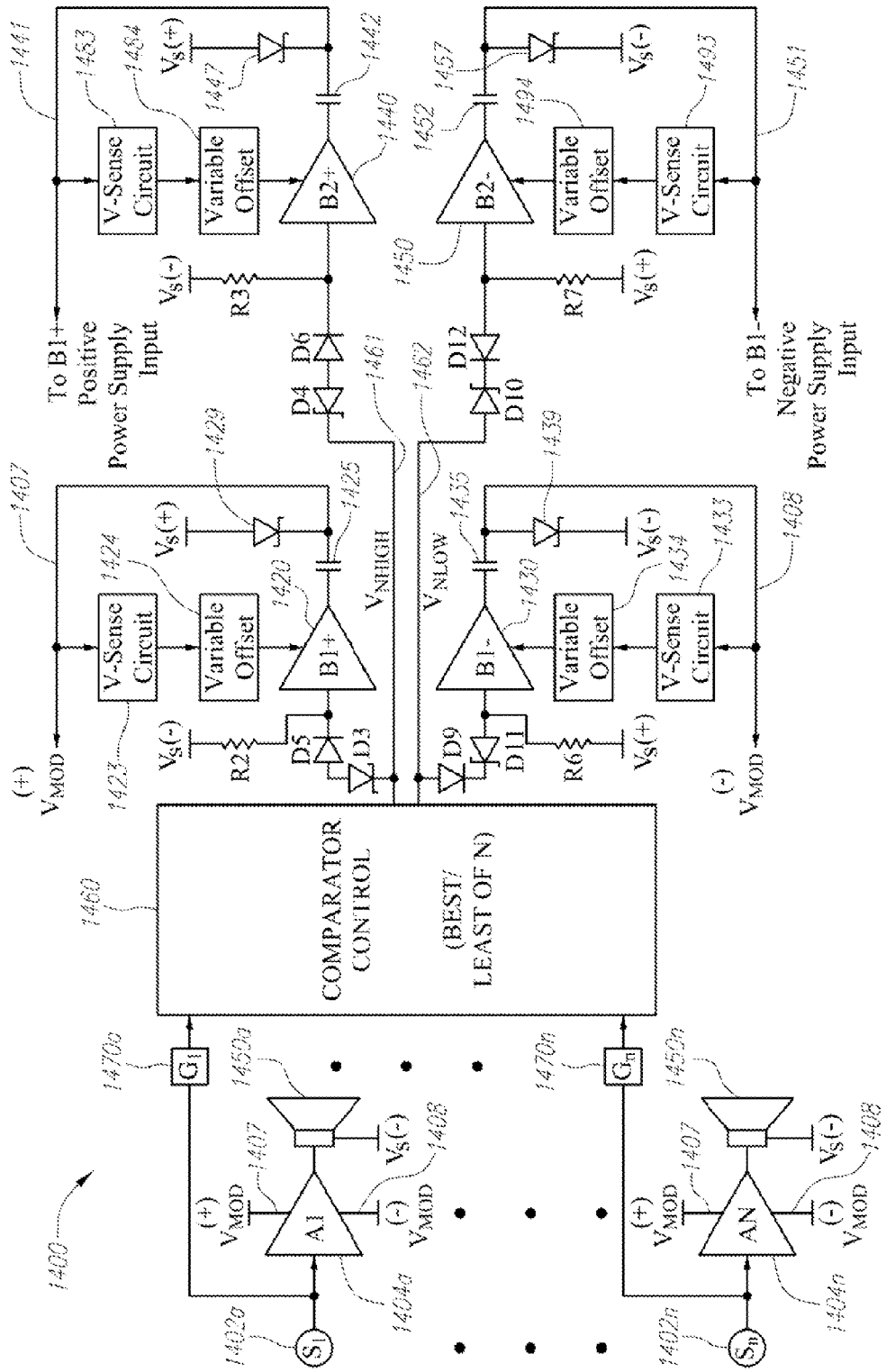
FIG. 14A is a diagram showing an example of an N-channel power amplifier including cascaded power rail boost circuitry according to one embodiment as disclosed herein.

The concepts described above with respect to FIGS. 10, 11, 12 and 13 may be applied to multi-channel amplifiers using the same techniques as described earlier. As one example, FIG. 14A shows an embodiment of a power boost circuit for an amplifier employing the feedback control approach of FIGS. 8B and 9 expanded to the general case of N amplifiers 1404*a* . . . *n*, and using a set of cascaded power boost amplifiers for both the positive and negative supply rails for the main amplifiers 1404*a* . . . *n*. Similar to FIG. 9, the amplification system 1400 in FIG. 14A includes a comparator control circuit 1460 which determines the largest positive magnitude voltage ("best-of-N") from the various amplifier outputs 1405*a* . . . *n*, and the largest negative magnitude voltage ("least-of-N") from the various amplifier outputs 1405*a* . . . *n*, and provides these values (denoted $V_{NHIGH}$ and $V_{NLOW}$ in FIG. 14A) to the cascaded positive power boost amplifiers 1420, 1440 and cascaded negative power boost amplifiers 1430, 1450. In this example, the signal output levels of the main amplifiers 1404*a* . . . *n* are derived by multiplying the corresponding input signals 1402*a* . . . *n* by a suitable gain value $G_1$ . . . Gn via respective gain blocks 1470*a* . . . *n* matched to the gain of each of the main amplifiers 1402*a* . . . *n*, similar to examples described previously. The difference between the positive or negative supply voltages and the largest positive/negative output of any of the main amplifiers 1404*a* . . . *n* in FIG. 14A is used to drive the feedback loop. In this way, it can be ensured that the power supply voltage is always large enough to prevent any of the main amplifiers 1404*a* . . . *n* from clipping.

One general premise behind the approach of the amplification system 1400 in FIG. 14A is to sense directly the difference between the largest output voltage of the main amplifiers 1404*a* . . . *n* and the operative supply voltage, and to drive the output of the power boost amplifiers 1420, 1430, 1440, 1450 in such a way as to keep this difference constant (in the simplest implementation, at least) when providing a power boost function. To this end, the power boost amplifiers 1420, 1430, 1440, 1450 are preferably implemented as high gain type amplifiers and incorporate the output and power supply terminals of the main amplifier 1404 in a negative feedback loop.

In this embodiment, positive supply voltage sense circuits 1423, 1483 and negative supply voltage sense circuits 1433, 1493 sense the levels of the positive and negative supply voltages, respectively. These values are combined with the normal fixed offset, to arrive at a variable offset value, as reflected by positive variable offset circuits 1424, 1484 and negative variable offset circuits 1434, 1494 depicted in FIG. 14A. The negative feedback loop comes into operation once the largest output of the main amplifiers 1404*a* . . . *n* reaches to within a predetermined voltage difference from the power supply rail. At low output levels, power boost amplifiers 1420, 1430, 1440, 1450 are held at the positive and negative supply rails, Vs+ and Vs− respectively, and the main amplifiers 1404*a* . . . *n* operate from the power supply rails Vs+ and Vs− as normal. But as soon as the largest output of the main amplifiers 1404*a* . . . *n* reaches to within a certain amount (e.g., 1.3 Volts) of the positive supply rail Vs+, then the feedback loop starts to drive the output of the first positive power boost amplifier 1420 positive (a similar phenomenon occurs with respect to the first negative power boost amplifier 1430 when the largest negative output of the main amplifiers 1404*a* . . . *n* reaches within a certain amount of the negative supply rail Vs−). This action drives the power supply input signal 1407, or Vboost+, in a positive direction, via reservoir capacitor 1425, which therefore acts to reduce the difference voltage between the largest output 1461 of the main amplifiers 1404*a* . . . *n* and the operative level of the positive power supply input 1407. This effect, in turn, reduces the drive signal into the first positive power boost amplifier 1420.

The foregoing effects result from the action of the negative feedback loop, and provided that the loop is designed to be stable, act to prevent the difference between the largest output 1461 of the main amplifiers 1404*a* . . . *n* and the operative positive supply voltage falling below the reference level. The voltage levels of the output signals of the main amplifiers 1404*a* . . . *n* are determined by the signals 1402*a* . . . *n* applied to their respective inputs, as occurs normally for amplifiers operating in a linear region of operation, so the action of the feedback loop once operational is to allow the power supply voltage to track at a predetermined offset (e.g., 1.3 Volts) above the largest output voltage signal 1461 of the main amplifier 1404*a* . . . *n*. As a result, the main amplifiers 1404*a* . . . *n* do not clip, and the main amplifiers 1404*a* . . . *n* may continue to drive an increasing voltage into their loads so long as the power boost amplifiers 1420, 1430 do not clip. This effect is similar to that described with respect to the system 1100 shown in FIG. 11 regarding increased output capability, ultimate clipping levels and efficiency of the main amplifiers 1404*a* . . . *n*. There is no need to match the gain of the power boost amplifiers 1420, 1430 to that of any of the main amplifiers 1404*a* . . . *n*.

Ideally, the gain of first positive and negative power boost amplifiers 1420, 1430 would be infinite if the difference voltage is to be maintained at a constant level. This, however, is impractical, and with a finite gain the voltage difference will decrease at large voltage swings. Such a situation is typically the opposite of what is desired. Rather, it is often preferable to have the voltage difference increase at high output levels. Such an effect can be achieved by using reference level that varies with an increase in main amplifier signal output level. As previously described, the system 1400 in FIG. 14A senses the difference between the largest output of the main amplifiers 1404a . . . n and its supply terminals, and acts to prevent this difference falling below a certain reference level. This reference level is preferably made to increase in proportion with the main amplifier signal output level, using variable offset circuits 1424, 1434, which act to offset the error due to the finite gain of the power boost amplifiers 1420, 1430. If the proportionality constant is appropriately chosen, the effect of limited gain can be exactly cancelled so that the difference between the largest output signal 1461 or 1462 of the main amplifiers 1404a . . . n and the respective positive or negative power supply terminal will be maintained at a constant voltage once the feedback loop operates. If the proportionality constant is higher than this amount, the voltage difference will increase with output level, mimicking the effect that would be obtained when the power boost amplifiers 1420 and 1430 (B1+ and B1−) have a gain of greater than unity.

The feedback arrangement described with respect to FIG. 14A also overcomes potential problems encountered with drooping of the reservoir capacitor voltage. Because the reservoir capacitors 1425, 1435 are enclosed within the feedback loop, the droop will initially have no effect. The power boost amplifier 1420 or 1430 will be automatically driven harder to compensate for the droop. Once the power boost amplifier 1420 or 1430 saturates at its supply rails, this correction will no longer occur, and the output of the largest of the main amplifiers 1404a . . . n will be driven into clipping (absent further boost as provided by the cascaded power boost circuitry as detailed herein), but there will generally not be a catastrophic collapse of output voltage.

A similar operation occurs with respect to the second positive and negative power boost circuits. Thus, when the largest output of the main amplifiers 1404a . . . n reaches to within a certain amount (e.g., 1.5 Volts) of three times the positive supply rail (i.e., 3 Vs+), then a second positive-boost feedback loop starts to drive the output of the second positive power boost amplifier 1440 positive (a similar phenomenon occurs with respect to the second negative power boost amplifier 1450 when the largest negative output of the main amplifiers 1404a . . . n reaches within a certain amount of three times the negative supply rail, or 3 Vs−). This action drives the power supply input signal 1441 for the first positive power boost amplifier 1420 in a positive direction, via reservoir capacitor 1442, which in turn prevents the first positive power boost amplifier 1420 from clipping and allows it to continue to raise the power supply input 1407 (Vboost+) for the main amplifiers 1404a . . . n in a positive direction. This acts to reduce the difference in voltage between the largest output 1461 of the main amplifiers 1404a . . . n and the operative level of the positive power supply input 1441 for the first positive power boost amplifier 1420. This effect, in turn, reduces the drive signal into the second positive power boost amplifier 1440.

The foregoing effects result from the action of the negative feedback loop (i.e, the second positive-boost feedback loop), and provided that the loop is designed to be stable, act to prevent the difference between the largest output 1461 of the main amplifiers 1404a . . . n and the operative positive supply voltage 1441 for the first positive power boost amplifier 1420 from falling below the reference level. The same is true for the second negative power boost amplifier 1450, which, in an analogous fashion, is fed by a variable offset circuit 1494 as part of a second negative-boost feedback loop to maintain the difference in voltage between the most negative output 1462 of the main amplifiers 1404a . . . n and the operative level of the negative power supply input 1451 for the first negative power boost amplifier 1430. As a result, the main amplifiers 1404a . . . n do not clip, and the main amplifiers 1404a . . . n may continue to drive an increasing voltage into their loads, either in a positive or negative direction, so long as the power boost amplifiers 1420, 1430 do not clip. This effect is also similar to that described with respect to the system 1100 shown in FIG. 11 regarding increased output capability, ultimate clipping levels and efficiency of the main amplifiers 1404a . . . n. There is no need to match the gain of the second positive or negative power boost amplifiers 1440, 1450 to that of any of the main amplifiers 1404a . . . n.

Ideally, the gain of second positive and negative power boost amplifiers 1440, 1450 would be infinite if the difference voltage is to be maintained at a constant level. As explained with respect to the first positive and negative power boost amplifiers 1420, 1430, it is possible to have the voltage difference increase at high output levels by using a reference level that varies with an increase in main amplifier signal output level. The second positive and negative power boost circuits in FIG. 14A sense the difference between the largest output (positive or negative, respectively) of the main amplifiers 1404a . . . n and its supply terminals, and act to prevent this difference falling below a certain reference level. This reference level is preferably made to increase in proportion with the main amplifier signal output level, using variable offset circuits 1484, 1494, which as before, act to offset the error due to the finite gain of the power boost amplifiers 1440, 1450. If the proportionality constant is appropriately chosen, the effect of limited gain can be exactly cancelled so that the difference between the largest output signal 1461 or 1462 of the main amplifiers 1404a . . . n and the respective positive power-boost power supply input signal 1441 or negative power-boost power supply input signal 1451 will be maintained at a constant voltage once the second positive-boost/negative-boost feedback loop operates. If the proportionality constant is higher than this amount, the voltage difference will increase with output level, mimicking the effect that would be obtained when the power boost amplifiers 1440 and 1440 (B2+ and B2−) have a gain of greater than unity.

The feedback arrangement described with respect to FIG. 14A also overcomes potential problems encountered with drooping of the reservoir capacitor voltage. Because the reservoir capacitors 1442, 1452 are enclosed respectively within the second positive-boost/negative-boost feedback loops, the droop will initially have no effect. The power boost amplifier 1440 or 1450 will be automatically driven harder to compensate for the droop. Once the power boost amplifier 1440 or 1450 saturates at its supply rails, this correction will no longer occur, and the output of the largest of the main amplifiers 1404a . . . n will be driven into clipping, but there will generally not be a catastrophic collapse of output voltage.

Figure 14B:
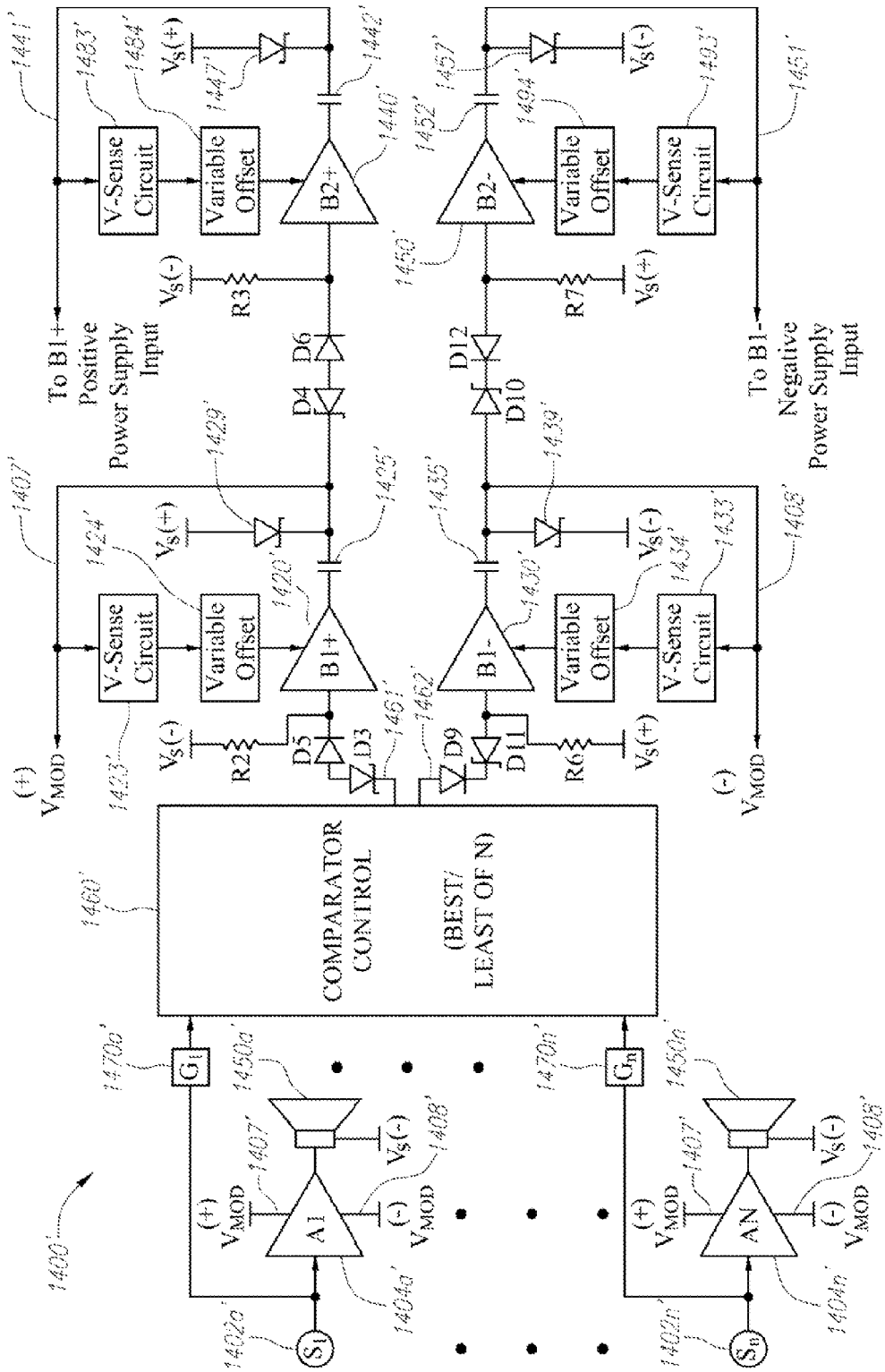
FIG. 14B is a diagram showing an example of an N-channel power amplifier including cascaded power rail boost circuitry according to another embodiment as disclosed herein, where the output of a first power boost stage is coupled to the downstream power boost stage.

FIG. 14B is a diagram showing another example of an N-channel power amplifier 1400' including cascaded power boost circuitry, according to another embodiment. In FIG.

14B, elements labeled "14xx'" generally correspond to like elements in FIG. 14A labeled "14xx". The primary difference is that in FIG. 14B, instead of voltage offset networks of the second stage positive power boost amplifier 1440' and second stage negative power boost amplifier 1450' being coupled to the highest and lowest amplifier signals 1461', 1462' respectively, the second stage positive power boost amplifier 1440' is coupled to the positive power supply signal 1407' for the main amplifiers 1404a' . . . n', and the second stage negative power boost amplifier 1450' is coupled to the negative power supply signal 1408' for the main amplifiers 1404a' . . . n', which are controlled by the first stage positive and negative power boost amplifiers 1420', 1430' respectively. Therefore, the general effect is the same, with the second stage positive and negative power boost amplifiers 1440', 1450' reacting indirectly to peak swings of the highest and lowest main amplifier output signals 1461', 1462'.

A variation of the feedback approach described with respect to FIGS. 14A and 14B can also be adopted whereby rather than sensing the difference between the power supply voltage and the amplified inputs of the main amplifiers 1404a . . . n (or 1404a' . . . n'), the difference between the power supply voltage and the direct outputs from the main amplifiers 1404a . . . n (or 1404a' . . . n') are instead used to drive the feedback loop. In such a case, gain stages 1470a . . . n (or 1470a' . . . n') would be unnecessary.

As with some of the other multi-channel embodiments described herein, the main amplifiers 1404a . . . n (or 1404a' . . . n') with lower output voltage will typically end up with more than the necessary supply voltage and so their efficiency can suffer somewhat, but this will often be an acceptable trade-off.

The same principles of the systems in FIGS. 14A and 14B are also applicable to cascaded power boost systems with more than two cascaded power boost circuits.

In alternative embodiments, instead of comparator control 1460 or 1460' in FIGS. 14A and 14B outputting the highest or lowest main amplifier output signal, the comparator control may be replaced by a slightly more sophisticated controller that also compares the highest or lowest main amplifier output signal against appropriate threshold levels that would cause activation of the first and second positive and/or negative power boost circuits. In such a case, the voltage offset networks would not be used, but would be replaced by comparison circuitry within the controller. In FIG. 14A, signals 1461 and 1462 would be replaced by two activation signals each, one for the first stage positive or negative power boost amplifier and one for the second stage positive or negative power boost amplifier, while in FIG. 14B, signals 1461 and 1462 would be replaced by a single activation signal for the first positive of negative power boost amplifier, since the second stage power boost amplifiers 1440', 1450' are responsive directly to the output of the first stage power boost amplifiers 1420', 1430'.

Figure 15:
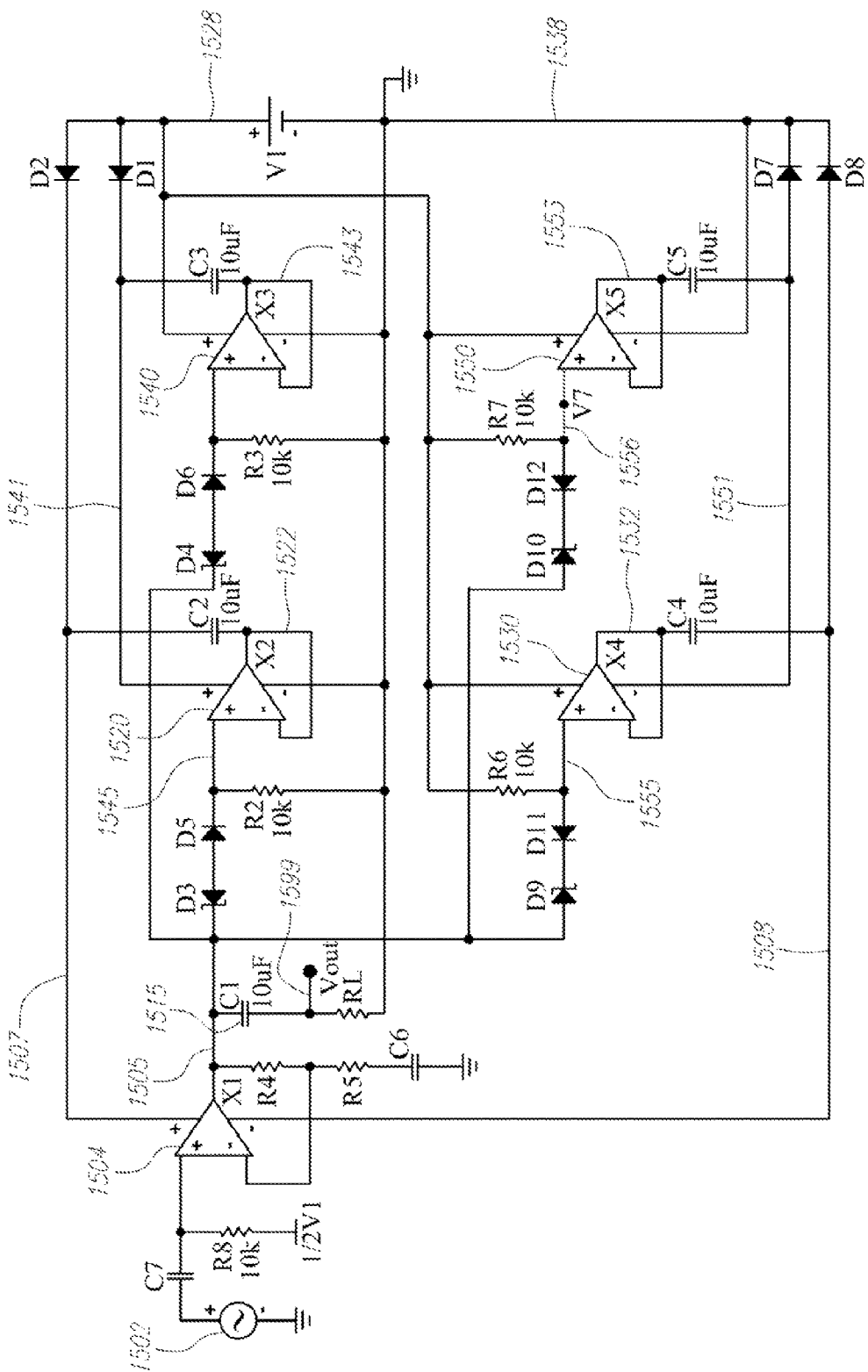
FIG. 15 is a circuit schematic diagram illustrating a tracking power supply with cascaded power boost circuits according to another embodiment as disclosed herein.
Figure 17:
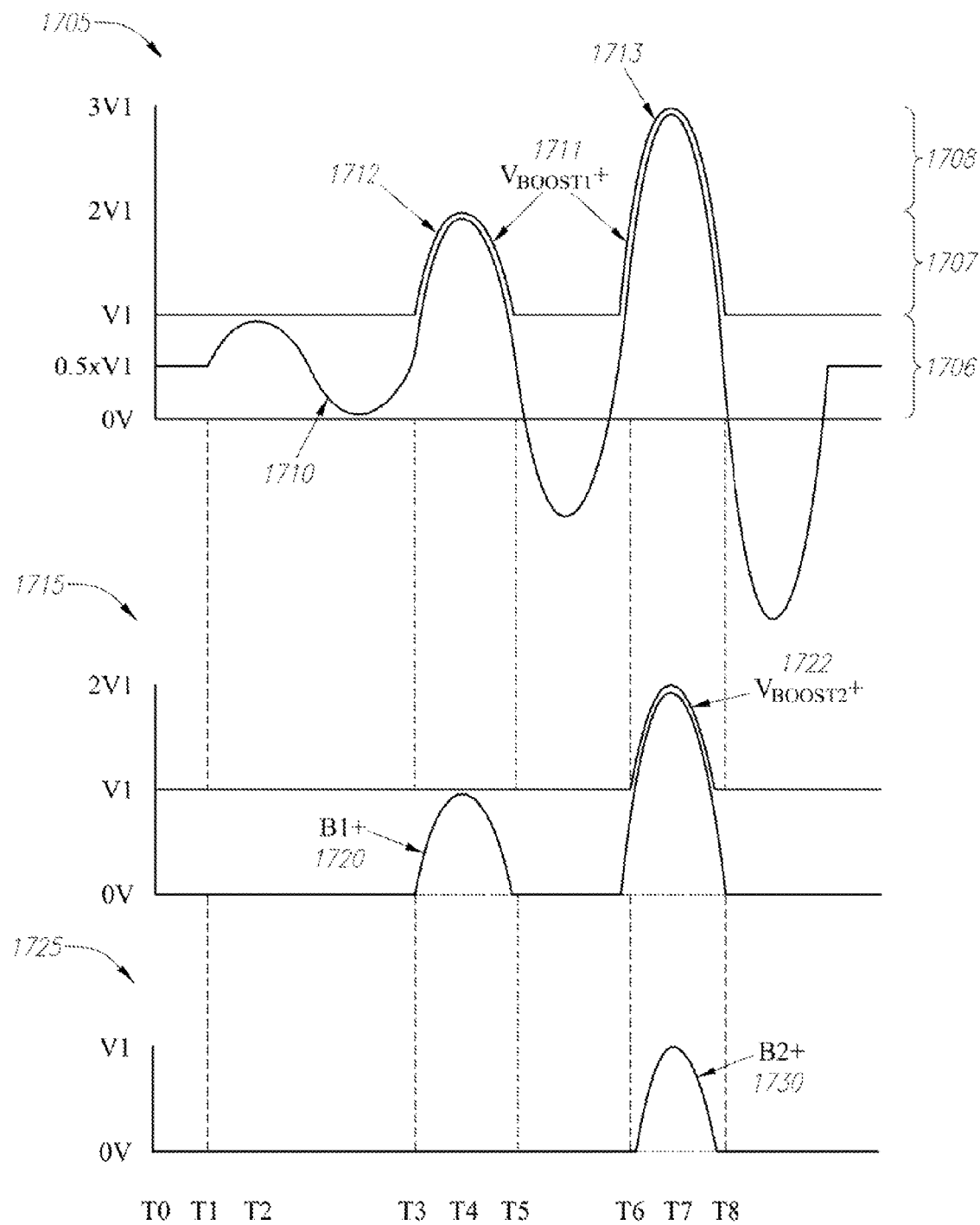
FIG. 17 illustrates a set of graphs illustrating an example of certain voltage waveforms and relationship pertaining to operation of the power boost circuitry of FIG. 15.

While a number of embodiments illustrated or discussed herein have generally been described with respect to positive and negative power supply rails, it should be understood and appreciated that the negative power supply rail could equivalently be set to ground, and/or that the power boost circuitry may operate with one power supply rail or power source. FIG. 15 is a circuit schematic diagram illustrating such an example of a tracking power supply 1500 with cascaded power boost circuits according to an embodiment as disclosed herein, and FIG. 17 illustrates a set of graphs illustrating an example of certain voltage waveforms and relationship pertaining to operation of the power boost circuitry of FIG. 15. In the embodiment of FIG. 15, elements labeled "15xx" generally correspond to like-numbered elements "13xx" in FIG. 13. Thus, like FIG. 13, the embodiment in FIG. 15 includes a main amplifier 1504 (denoted "A1") amplifies a source signal 1502. The main amplifier 1504 has an output signal 1599 which may be connected, for example, to a loudspeaker (not shown), optionally through a coupling capacitor 1515 ("C1"). Similar to with FIG. 13, the main amplifier 1504 is preferably coupled to the power rail 1528 (V1) through diode D2, but instead of being connected to a negative power supply line it is connected to ground 1538 through diode D8. The power supply inputs of the first positive power boost amplifier 1520 (B1+) associated with the first positive power boost circuit are preferably coupled to the power rail 1528 (V1) through diode D1 and directly to ground 1538. The power supply inputs of the first negative power boost amplifier 1530 (B1−) associated with the first negative power boost circuit are preferably coupled directly to the power rail 1528 (V1) and also to ground 1538 through diode D8. The first positive and first negative power boost amplifiers 1520 and 1530 are respectively coupled to the power supply inputs 1507, 1508 (also referred to as Vboost1+ and Vboost1−) of the main amplifier 1504 via reservoir capacitors C2 and C4 (or other stored energy sources) respectively.

The power supply inputs of the second positive power boost amplifier 1540 (B2+) associated with the second positive power boost circuit and the second negative power boost amplifier 1550 (B2−) associated with the second negative power boost circuit are coupled to power rail 1528 (V1) and ground 1338, respectively. The second positive power boost amplifier 1540 is coupled to the power supply input 1541 (Vboost2+) of the first positive power boost amplifier 1520 via reservoir capacitor C3. The second negative power boost amplifier 1550 is coupled to the negative power supply input 1551 (Vboost2−) of the first negative power boost amplifier 1530 via reservoir capacitor C5.

In operation, the circuit of FIG. 15 operates in generally the same way as previously described with respect to the circuits of FIGS. 11 and 13, thus providing a large increase in the voltage swing normally available to the main amplifier 1504. FIG. 17 shows a related set of graphs illustrating various simplified waveforms according to one particular example, very similar to the example in FIG. 12 for waveforms relating to the FIG. 11 power supply embodiment. In FIG. 17, similar to FIG. 12, the topmost graph 1705 illustrates the output of the main amplifier A1 as illustrated by signal waveform 1710, and also shows a power boost signal 1711 provided to the positive supply input of the main amplifier A1. Also shown in FIG. 17 are graphs 1715 and 1725 showing the operation of first and second stages of the cascaded power boost circuitry according to this example. The signal waveform 1710 thus represents the output 1505 of the main amplifier 1504 in FIG. 15, the solid waveform line 1720 (also denoted "B1+") represents the output signal 1522 from the first positive power boost amplifier 1520 in FIG. 15, and the solid waveform line 1730 (also denoted "B2+") represents the output signal 1543 from the second positive power boost amplifier 1540 in FIG. 15. Signals 1711 and 1722 (also denoted as Vboost1+ and Vboost2+) respectively represent the power supply input signals 1507, 1541 having the same designations in FIG. 15.

As illustrated in FIG. 17, during the time period T0-T1 representing quiescent conditions, the first positive power boost amplifier output 1720 (waveform B1+) in graph 1715 and second positive power boost amplifier output 1730 (waveform B2+) in graph 1725 are at ground potential, the main amplifier power supply input 1711 (waveform Vboost1+) in graph 1705 and first positive power boost amplifier power supply input 1722 (waveform Vboost2+) in graph 1715 are at V1 potential, and main amplifier output signal 1710 (waveform A1) is at 0.5·V1 potential.

At time period T1, the main amplifier output signal 1710 begins to vary. During the entire time period from T0-T3, main amplifier output signal 1710 (waveform A1) stays beneath the power supply rail voltage V1 and ground, and thus waveforms B1+, B2+, Vboost1+, and Vboost2+ continue to remain at quiescent voltage levels as no power boost is yet needed.

In period T3-T4, as main amplifier output signal 1710 (waveform A1) approaches the power supply rail voltage V1 and eventually reaches a first peak 1712 less than twice V1 in voltage level, the voltage offset network diodes D3 and D5 then conduct and input 1545 (in FIG. 15) to the first positive boost amplifier 1520 starts to follow main amplifier output signal 1710 (waveform A1). First positive power boost amplifier output signal 1720 (waveform B1+) therefore rises and main amplifier power supply input signal 1711 (waveform Vboost1+) tracks and stays above waveform A1 by some offset amount equal or corresponding to, for example, offset Δ1 discussed earlier in connection with FIG. 12. Thus, the main amplifier output signal 1710 (waveform A1) is prevented from clipping and can continue to rise.

For time period T4-T5, as main amplifier output signal 1710 (waveform A1) falls, the main amplifier power supply input signal 1711 (waveform Vboost1+) follows until waveform Vboost1+ is once again at potential equal to the power supply rail V1, at which point waveform Vboost1+ is again clamped by the conduction of diode D2. As the voltage level of the main amplifier output signal 1710 (waveform A1) falls further, the first positive power boost amplifier output signal 1720 (waveform B1+) falls towards ground potential, thereby recharging capacitor C2.

During time period T6-T8, as the level of the main amplifier output signal 1710 (waveform A1) exceeds a potential of twice V1 and approaches a second peak 1713 beyond that level of nearly three times V1, the level of the first positive power boost amplifier output signal 1720 (waveform B1+) needs to correspondingly rise above V1 in order to adequately supply the main amplifier 1704. Accordingly, as the main amplifier output signal 1710 rises during time period T6-T8, the voltage offset network diodes D4 and D6 start to conduct and cause the second positive power boost amplifier output signal 1730 (waveform B2+) to rise in tandem with the output from the first positive power boost amplifier output signal 1720, offset by some threshold amount equal or corresponding to, for example, offset 42 as discussed previously in connection with FIG. 12. This action increases first positive power boost amplifier power supply input 1722 (waveform Vboost2+), which prevents the first positive power boost amplifier output signal 1720 (waveform B1+) from clipping and allows the main amplifier power supply input 1711 (waveform Vboost1+) to continue increasing, thereby preventing main amplifier output signal 1710 (waveform A1) from clipping as well. This action continues until the level of the second positive power boost amplifier output signal 1730 (waveform B2+) clips at a potential of V1, at which point there is no greater output available from first positive power boost amplifier output signal 1720 (waveform B1+) or main amplifier output signal 1710 (waveform A1), and the waveform A1 finally clips at a positive output voltage of three times V1.

In a practical implementation, as noted elsewhere, there may be some droop or decay of the offset level over time, and previously described embodiments described herein are addressed to techniques for mitigating the effect of any droop or decay.

The power boost for cascaded negative power boost circuitry would operate in a similar, but inverse, manner.

An amplification system configured in accordance with any of FIGS. 10 through 16 can be built without a bridged amplifier arrangement and without a switching power supply, yet still have a large voltage swing capability. The increased voltage swing, on the order of 69 Volts peak-to-peak from a 14.4 Volt power supply for a cascade of two power boost circuits (more for larger cascades), means that approximately 74 Watts can be delivered into an 8Ω load, as compared to the typical 3 Watts for a conventional amplifier, or roughly 12 Watts for a bridged amplifier. For a 14.5Ω load, which draws less current than an 8Ω load (thus being limited to about 2.4 Amps for the output signal), 41 Watts can be delivered using a cascade of two power boost circuits (82 Watts if used in bridge mode) utilizing some of the embodiments discussed herein. For purposes of comparison, taking maximum current capability as the limiting factor (roughly in the range of 2.4 Amps for an amplification system in a typical setting), only about 8.5 Watts would be available into 3 Ohms for a conventional amplifier, and about 17 Watts into 6 Ohms from a bridged amplifier, but at increased distortion due to the lowered load impedance presented to the amplifiers.

In a practical system, there may be limitations on the ability of the cascaded power boost circuits in FIGS. 10 through 16 to swing fully to their maximum rail voltages, or for the main amplifier(s) to swing fully to the maximum boosted rail voltages. However, with careful design, particularly according to techniques described later herein, such limitations may be minimized.

Another advantage that may be provided by the power boost systems of FIGS. 10 through 16 is reduced power dissipation. The main amplifier (or amplifiers) generally dissipates much less power than a conventional amplifier of the same output power capability, as there is less voltage loss across its output power transistors. Thus, the power transistors of the main amplifier(s) can have lower voltage and/or power ratings than a conventional amplifier, although they should still be capable of passing the full output current. The power transistors used for the power boost amplifiers may also have low voltage/power ratings as they are generally not subject to a greater voltage than the difference between the supply rails (that is, Vs+−Vs−). Although the peak power dissipation in the various amplifiers of the systems of FIGS. 10 through 16 may at times be relatively high, the overall power dissipation may remain low particularly in settings where the input source signal(s) only occasionally require high output power. For example, in audio reproduction systems, the boost mode provided by the cascaded power boost circuits would, in typical expected situations, only be utilized occasionally because the average signal level in audio reproduction is considerably less than the peak level. For most of the time, the cascaded power boost circuits dissipate essentially no power, and so their average power dissipation is low. In addition to being power efficient, they also have the advantage of needing a smaller heatsink, since their average power dissipation is low.

As previously noted, to the extent not already expressly described, the principles of the amplification systems illustrated in FIGS. 10 through 16 may be extended to systems having more than one channel and/or more than one main amplifier. In multi-channel or multi-amplifier systems, it would be possible to provide positive and/or negative cascaded power boost circuits for each channel and/or main amplifier. Alternatively, it is possible to have cascaded positive and/or negative power boost circuits shared, in whole or part, among multiple channels and/or amplifiers.

While various power boost circuits as described herein may find useful application in audio amplification systems, they are by no means limited to such applications. Rather they may be employed in a variety of different contexts or environments, and may be used, for example, wherever a temporary power boost is needed.

While preferred embodiments of the invention have been described herein, many variations are possible which remain within the concept and scope of the invention. Such variations would become clear to one of ordinary skill in the art after inspection of the specification and the drawings. The invention therefore is not to be restricted except within the spirit and scope of any appended claims.

What is claimed is:

1. A tracking power supply for an amplification system, comprising:
   a first power boost circuit receiving, as an input, a first signal indicative of an output voltage of an amplifier, said amplifier receiving a first power supply input voltage signal either from a power supply rail when the amplifier output voltage is below a first threshold or from the first power boost circuit when the amplifier output voltage is above the first threshold; and
   a second power boost circuit receiving, as an input, a second signal indicative of the output voltage of said amplifier, wherein said first power boost circuit receives a second power supply input voltage signal from either the power supply rail, or from the second power boost circuit when the amplifier output voltage is above a second threshold, said second threshold being greater in absolute value than said first threshold, said first power boost circuit provides an output voltage that is greater than an input voltage of said first power boost circuit.

2. The tracking power supply of claim 1, wherein said first threshold is slightly below a fixed voltage provided by the power supply rail.

3. The tracking power supply of claim 1, wherein said second threshold is near but below a voltage level corresponding to approximately three times the fixed voltage provided by the power supply rail.

4. The tracking power supply of claim 1, wherein the combined effect of the first power boost circuit and second power boost circuit allows the amplifier to temporarily generate an output voltage of approximately five times the fixed voltage provided by the power supply rail.

5. The tracking power supply of claim 1, wherein the first signal indicative of an output voltage of an amplifier and the second signal indicative of an output voltage of an amplifier are the same signal.

6. The tracking power supply of claim 1, wherein said first power boost circuit and said second power boost circuit each comprise a stored energy source.

7. The tracking power supply of claim 6, wherein the stored energy source for at least one of said first power boost circuit and said second power boost circuit is a reservoir capacitor.

8. The tracking power supply of claim 6, wherein the stored energy source for at least one of said first power boost circuit and said second power boost circuit is a battery.

9. The tracking power supply of claim 6, wherein:
   said first power boost circuit directly or indirectly tracks the amplifier output voltage and temporarily boosts the first power supply input voltage signal feeding said amplifier by drawing current from its respective stored energy source when the output voltage from said amplifier approaches the first threshold, and
   said second power boost circuit directly or indirectly tracks the amplifier output voltage and temporarily boosts the second power supply input voltage signal feeding said first power boost circuit by drawing current from its respective stored energy source when the output voltage from said amplifier approaches the second threshold.

10. The tracking power supply of claim 9, wherein said first power boost circuit maintains the first power supply input voltage signal at a predetermined level in excess of the output voltage of said amplifier so long as the amplifier output voltage exceeds the first threshold.

11. The tracking power supply of claim 10, wherein said second power boost circuit maintains the second power supply input voltage signal feeding said first power boost circuit at a second predetermined level in excess of the first power supply input voltage signal so long as the first power supply input voltage exceeds the second threshold.

12. The tracking power supply of claim 1, wherein at least one of the first signal indicative of the output voltage of said amplifier and the second signal indicative of the output voltage of said amplifier is generated using a gain stage coupled to an input of said amplifier and having a gain matched to a gain of said amplifier.

13. The tracking power supply of claim 1, further comprising a voltage sense circuit for monitoring the boosted first power supply input voltage signal feeding the amplifier, and a variable offset circuit responsive to said voltage sense circuit for injecting a variable feedback signal into said first power boost circuit, said variable feedback signal proportional in magnitude to said first power supply input voltage signal.

14. The amplification system of claim 1, wherein said first power boost circuit receives a feedback signal corresponding to the boosted first power supply input voltage signal, and applies a variable gain factor for its power boost function that increases as the first power supply input voltage signal increases.

15. The tracking power supply of claim 1, further comprising a voltage sense circuit for monitoring the boosted second power supply input voltage signal feeding the first power boost circuit, and a variable offset circuit responsive to said voltage sense circuit for injecting a variable feedback signal into said second power boost circuit, said variable feedback signal proportional in magnitude to said second power supply input voltage signal.

16. The tracking power supply of claim 1, wherein said second power boost circuit receives a feedback signal corresponding to the boosted second power supply input voltage signal, and applies a variable gain factor for its power boost function that increases as the second power supply input voltage signal increases.

17. An amplification system utilizing a tracking power supply, comprising:
   a power supply rail configured to provide a fixed voltage;
   an amplifier having at least one power supply input coupled to said power supply rail; and
   a cascaded power boost circuit configured to temporarily boost a voltage level of said at least one power supply input to said amplifier up to an amount exceeding three times said fixed voltage when the output signal from said amplifier exceeds the fixed voltage level of said power supply rail.

18. The amplification system of claim 17, wherein said cascaded power boost circuit is configured to temporarily boost a voltage level of said at least one power supply input to said amplifier up to an amount approaching at least five times said fixed voltage when the output signal from said amplifier exceeds the fixed voltage level of said power supply rail.

19. The amplification system of claim 17, wherein said cascaded power boost circuit comprises:
   a first power boost circuit receiving, as an input, a first signal indicative of an output voltage of said amplifier, wherein said amplifier receives a first power supply input voltage signal at one of its power supply inputs either from said power supply rail when the output voltage is below a first threshold or from said first power boost circuit when the output voltage is above the first threshold; and
   a second power boost circuit receiving, as an input, a second signal indicative of the output voltage of said amplifier, wherein said first power boost circuit receives a second power supply input voltage signal from either the power supply rail when the output voltage is below a second threshold or from the second power boost circuit when the output voltage is above the second threshold.

20. The amplification system of claim 19, wherein said first power boost circuit is triggered by a first voltage offset network coupled to the amplifier output signal and comprising a first voltage reference circuit, and wherein the second power boost circuit is triggered by a second voltage offset network coupled to the amplifier output signal and comprising a second voltage reference circuit.

21. The amplification system of claim 20, wherein said first voltage reference circuit and said second voltage reference circuit each comprise a zener diode.

22. The amplification system of claim 19, wherein said first power boost circuit and said second power boost circuit each comprise a stored energy source.

23. The amplification system of claim 22, wherein the stored energy source for at least one of said first power boost circuit and said second power boost circuit is a reservoir capacitor.

24. The amplification system of claim 23, wherein the stored energy source for at least one of said first power boost circuit and said second power boost circuit is a battery.

25. A tracking power supply system for an amplifier, with independent positive and negative power supply rail boosting, comprising:
   a first power boost circuit coupled to a power supply input of an amplifier and configured to temporarily boost a power supply input voltage level to said amplifier to a first level when the output signal from said amplifier is at least at a first threshold; and
   a second power boost circuit coupled to said power supply input of the amplifier and configured to temporarily boost the power supply input voltage level to said amplifier to a second level that is greater than said first level when the output signal from said amplifier is at least at a second threshold.

26. The tracking power supply system of claim 25, wherein:
   said first power boost circuit comprises (i) a first positive power boost circuit coupled to the positive power supply input of said amplifier, and (ii) a second negative power boost circuit coupled to a positive power supply input of the first positive power boost circuit.

27. The tracking power supply system of claim 26, wherein said first power boost circuit is operative to boost the power supply input of said amplifier by an amount exceeding three times the voltage level of the power supply rail.

28. The tracking power supply system of claim 26, wherein said first power boost circuit boosts th power supply input voltage level to said amplifier by dynamically tracking excursions of the amplifier output signal near and exceeding the power supply rail.

29. The tracking power supply system of claim 26, wherein said first power boost circuit and said second power boost circuit each comprise a stored energy source.

30. The tracking power supply system of claim 29, wherein the stored energy source for at least one of said first power boost circuit and said second power boost circuit is a reservoir capacitor.

31. The tracking power supply system of claim 29, wherein the stored energy source for at least one of said first power boost circuit and said second power boost circuit is a battery.

32. The tracking power supply of claim 26, wherein:
   said first power boost circuit boosts the power supply input voltage level to said amplifier by drawing current from a first reservoir capacitor when the output signal from said amplifier surpasses the level of the power supply rail less a first predetermined rail threshold; and
   said second power boost circuit boosts the power supply input voltage level to said first power boost circuit by drawing current from a second reservoir capacitor when the output signal from said amplifier surpasses a voltage level equal to three times the power supply rail less a second predetermined positive rail threshold.

33. The tracking power supply system of claim 26, wherein said first cascaded power boost circuit receives a first feedback signal corresponding to the boosted positive power supply input voltage, and applies a first variable gain factor for its power boost function that increases as the positive power supply input voltage signal increases in magnitude, and wherein said second cascaded power boost circuit receives a second feedback signal corresponding to the boosted negative power supply input voltage, and applies a second variable gain factor for its power boost function that increases as the negative power supply input voltage signal increases in magnitude.

* * * * *